United States Patent
Yamamoto et al.

(10) Patent No.: US 9,666,823 B2
(45) Date of Patent: May 30, 2017

(54) ORGANIC ELECTROLUMINESCENT ELEMENT AND METHOD FOR MANUFACTURING THE SAME

(71) Applicant: SUMITOMO CHEMICAL COMPANY, LIMITED, Chuo-ku, Tokyo (JP)

(72) Inventors: Kyoko Yamamoto, Tsukuba (JP); Yoshinobu Ono, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 162 days.

(21) Appl. No.: 14/389,918

(22) PCT Filed: Apr. 4, 2013

(86) PCT No.: PCT/JP2013/060321
§ 371 (c)(1),
(2) Date: Oct. 1, 2014

(87) PCT Pub. No.: WO2013/151130
PCT Pub. Date: Oct. 10, 2013

(65) Prior Publication Data
US 2015/0048341 A1 Feb. 19, 2015

(30) Foreign Application Priority Data
Apr. 6, 2012 (JP) ................. 2012-087052

(51) Int. Cl.
*H01L 51/50* (2006.01)
*C09K 11/06* (2006.01)
(Continued)

(52) U.S. Cl.
CPC ............ *H01L 51/504* (2013.01); *C09K 11/06* (2013.01); *H01L 51/0003* (2013.01);
(Continued)

(58) Field of Classification Search
CPC ... H01L 51/504; H01L 51/0003; H01L 51/56; H01L 51/5203; H01L 51/5036; H01L 51/0039; C09K 11/06; C09K 2211/14
See application file for complete search history.

(56) References Cited

U.S. PATENT DOCUMENTS

2003/0124381 A1 7/2003 Thompson et al.
2006/0199943 A1 9/2006 Falcou et al.
(Continued)

FOREIGN PATENT DOCUMENTS

GB 2442724 A 4/2008
JP 2007-505958 A 3/2007
(Continued)

OTHER PUBLICATIONS

Communication dated Nov. 18, 2015 from the State Intellectual Property Office of the People's Republic of China in counterpart Application No. 201380018347.2.
(Continued)

*Primary Examiner* — Donald Raleigh
*Assistant Examiner* — Kevin Quaterman
(74) *Attorney, Agent, or Firm* — Sughrue Mion, PLLC

(57) ABSTRACT

Organic electroluminescent element capable of conveniently and precisely establishing the emission color of the element. The organic electroluminescent element includes a pair of electrodes and a light-emitting layer provided between the electrodes and presents an emission color at the coordinate Ao (Xo, Yo) in CIE 1931 chromaticity coordinate system. The light-emitting layer contains in the same layer, a light emitting material A1 that presents an emission color at the coordinate A1 (x1, y1) in the CIE 1931 chromaticity coordinate system and a light emitting material A2 that presents an emission color at the coordinate A2 (x2, y2) in the CIE 1931 chromaticity coordinate system; a distance $L_{Ao\text{-}A1}$ between the coordinates Ao (Xo, Yo) and A1 (x1, y1) in the CIE 1931 chromaticity coordinate system satisfies $L_{Ao\text{-}A1} \leq 0.20$; and a distance $L_{A1\text{-}A2}$ between the coordinates A1 (x1, y1) and A2 (x2, y2) in the CIE 1931 chromaticity coordinate system satisfies $0.13 \leq L_{A1\text{-}A2} \leq 0.35$ s.

2 Claims, 6 Drawing Sheets

(51) Int. Cl.
*H01L 51/52* (2006.01)
*H01L 51/56* (2006.01)
*H01L 51/00* (2006.01)

(52) U.S. Cl.
CPC ...... *H01L 51/5036* (2013.01); *H01L 51/5203* (2013.01); *H01L 51/56* (2013.01); *C09K 2211/14* (2013.01); *H01L 51/0039* (2013.01)

(56) References Cited

U.S. PATENT DOCUMENTS

| | | |
|---|---|---|
| 2007/0236136 A1 | 10/2007 | Jou et al. |
| 2009/0014690 A1 | 1/2009 | Falcou et al. |
| 2009/0309094 A1 | 12/2009 | Frey et al. |
| 2010/0197875 A1 | 8/2010 | Falcou et al. |
| 2010/0320454 A1 | 12/2010 | Wilson et al. |
| 2012/0108731 A1* | 5/2012 | Heun ................. C08G 61/02 524/500 |
| 2013/0237680 A1 | 9/2013 | Wilson et al. |

FOREIGN PATENT DOCUMENTS

| | | | |
|---|---|---|---|
| JP | 2007-525564 A | 9/2007 | |
| JP | 2009-528400 A | 8/2009 | |
| JP | 2011-512424 A | 4/2011 | |
| WO | 2010/149258 A1 | 12/2010 | |
| WO | WO 2010149258 A1 * | 12/2010 | ............. C08G 61/02 |

OTHER PUBLICATIONS

Communication dated Jun. 2, 2015 from the Japanese Patent Office in counterpart application No. 2014-509204.
International Search Report for PCT/JP2013/060321 dated Jul. 16, 2013.
Communication dated Nov. 9, 2015 from the European Patent Office in counterpart European Application No. 13772149.4.

* cited by examiner

ORGANIC ELECTROLUMINESCENT ELEMENT AND METHOD FOR MANUFACTURING THE SAME

CROSS REFERENCE TO RELATED APPLICATIONS

This application is a National Stage of International Application No. PCT/JP2013/060321 filed Apr. 4, 2013, claiming priority based on Japanese Patent Application No. 2012-087052 filed Apr. 6, 2012, the contents of all of which are incorporated herein by reference in their entirety.

TECHNICAL FIELD

The present invention relates to an organic electroluminescent element and a method for manufacturing the same.

BACKGROUND ART

The organic electroluminescent element (hereinafter, also called the "organic EL element") is a light emitting element using an organic compound as a functional material such as a light emitting material. For the organic EL element, there has been an attempt to achieve various emission colors by using a plurality of light emitting materials having different light emission wavelengths in combination. For example, Patent Document 1 discloses an organic EL element including a light-emitting layer in which a plurality of light emitting materials having different light emission wavelengths are contained in the same layer.

RELATED ART DOCUMENT

Patent Document

Patent Document 1: JP-T-2009-528400

SUMMARY OF THE INVENTION

Problem to be Solved by the Invention

An emission color of the organic EL element is determined by integrating of light emitted from light emitting moieties contained in light emitting materials. From the viewpoint of conveniently and precisely establishing various emission colors (for example, emission colors in a white region which is distant from the monochromatic spectral line and emission colors in a color mixture region of a low chroma in CIE chromaticity coordinate system), it is preferred that the emission color of the organic EL element is linearly changed based on the emission color and the mixing ratio of each light emitting material.

For example, when a light emitting material 1 containing a light emitting moiety 1 that presents an emission color at the coordinate (x1, y1) in CIE chromaticity coordinate system in a concentration (number density of the light emitting moiety per unit weight of the light emitting material) of [c1] and a light emitting material 2 containing a light emitting moiety 2 that presents an emission color at the coordinate (x2, y2) in a concentration of [c2], are used in combination of a weight w1 of the light emitting material 1 with a weight w2 of the light emitting material 2, it is preferred that the color coordinate (Xo, Yo) of the emission color of the organic EL element can be estimated by the following chromaticity relational formulae.

$$Xo = (x2 - x1)m + x1$$ [Numerical Formula 1]
$$Yo = (y2 - y1)m + y1$$

wherein $$m \text{ is } \frac{w2 \cdot [c2]}{w1 \cdot [c1] + w2 \cdot [c2]}$$

In the above chromaticity relational formulae, x1, y1 and [c1] are characteristic values of the light emitting material 1, and x2, y2 and [c2] are characteristic values of the light emitting material 2. Therefore, when the types of the light emitting material used in combination are decided, the emission color of the organic EL element can be established substantially as a linear function based on the weights w1 and w2 of the light emitting materials.

However, in the technique disclosed in Patent Document 1 in which a light emitting material 1 and a light emitting material 2 are contained in the same layer, when an electron and a hole are recombined in a light emitting moiety 1 of the light emitting material 1 to form an exciton, an energy transfer from such an exciton to a light emitting moiety 2 of the light emitting material 2 easily occurs. When such an energy transfer between the light emitting moieties occurs, the above chromaticity relational formulae based on the presupposition that the light emitting moiety 1 and the light emitting moiety 2 independently act, are not valid. Consequently, there is a difference between the actual values of the color coordinate of the emission color and the estimated values of the color coordinate of the emission color obtained by the calculation, so that for establishing precisely the emission color of the organic EL element, excessive processes of trial and error are inevitable.

The present invention has been invented for solving the above problems that the related-art has. It is an object of the present invention to provide an organic EL element capable of conveniently and precisely establishing the emission color of the element as a linear function based on the emission color and the mixing ratio of each light emitting material, and a method for manufacturing the same.

Means for Solving Problem

For solving the above problems, the present invention provides an organic electroluminescent element that adopts the following configurations, and a method for manufacturing the same.

[1] An organic electroluminescent element that presents an emission color at the coordinate Ao (Xo, Yo) in CIE 1931 chromaticity coordinate system, comprising:
a pair of electrodes; and
a light-emitting layer provided between the electrodes, wherein
the light-emitting layer comprises in the same layer, a light emitting material A1 that presents an emission color at the coordinate A1 (x1, y1) in CIE 1931 chromaticity coordinate system and a light emitting material A2 that presents an emission color at the coordinate A2 (x2, y2) in CIE 1931 chromaticity coordinate system,
a distance $L_{Ao\text{-}A1}$ between the coordinates Ao (Xo, Yo) and A1 (x1, y1) in CIE 1931 chromaticity coordinate system satisfies $L_{Ao\text{-}A1} \leq 0.20$, and
a distance $L_{A1\text{-}A2}$ between the coordinates A1 (x1, y1) and A2 (x2, y2) in CIE 1931 chromaticity coordinate system satisfies $0.13 \leq L_{A1\text{-}A2} \leq 0.35$.

[2] The organic electroluminescent element of the above [1], wherein the light-emitting layer comprises in the same layer, a light emitting material A3 that presents an emission color at the coordinate A3 (x3, y3) in CIE 1931 chromaticity coordinate system in addition to the light emitting materials A1 and A2, and when a color coordinate of an emission color by the sum of the light emitting materials A1 and A2 is assumed to be Ad (xd, yd), a distance $L_{Ad\text{-}A3}$ between the coordinates Ad (xd, yd) and A3 (x3, y3) in CIE 1931 chromaticity coordinate system satisfies $0.13 \leq L_{Ad\text{-}A3} \leq 0.35$.

[3] The organic electroluminescent element of the above [1] or [2], wherein the light emitting material A1 is a white light emitting material and the light emitting material A2 is a light emitting material that presents an emission color other than white.

[4] The organic electroluminescent element of the above [3], wherein the white light emitting material is a white light emitting polymer material.

[5] A method for manufacturing an organic electroluminescent element that presents an emission color at the coordinate Ao (Xo, Yo) in CIE 1931 chromaticity coordinate system and comprises a pair of electrodes and a light-emitting layer provided between the electrodes, the method comprising the step of:

forming the light-emitting layer by applying an applying liquid comprising a light emitting material A1 that presents an emission color at the coordinate A1 (x1, y1) in CIE 1931 chromaticity coordinate system, a light emitting material A2 that presents an emission color at the coordinate A2 (x2, y2) in CIE 1931 chromaticity coordinate system and a solvent, wherein a distance $L_{Ao\text{-}A1}$ between the coordinates Ao (Xo, Yo) and A1 (x1, y1) in CIE 1931 chromaticity coordinate system satisfies $L_{Ao\text{-}A1} \leq 0.20$, and a distance $L_{A1\text{-}A2}$ between the coordinates A1 (x1, y1) and A2 (x2, y2) in CIE 1931 chromaticity coordinate system satisfies $0.13 \leq L_{A1\text{-}A2} \leq 0.35$.

[6] The method for manufacturing an organic electroluminescent element of the above [5], wherein the applying liquid further comprises a light emitting material A3 that presents an emission color at the coordinate A3 (x3, y3) in CIE 1931 chromaticity coordinate system, and when a color coordinate of an emission color by the sum of the light emitting materials A1 and A2 is assumed to be Ad (xd, yd), a distance $L_{Ad\text{-}A3}$ between the coordinates Ad (xd, yd) and A3 (x3, y3) in CIE 1931 chromaticity coordinate system satisfies $0.13 \leq L_{Ad\text{-}A3} \leq 0.35$.

[7] The method for manufacturing an organic electroluminescent element of the above [5] or [6], wherein the light emitting material A1 is a white light emitting material and the light emitting material A2 is a light emitting material that presents an emission color other than white.

[8] The method for manufacturing an organic electroluminescent element of the above [7], wherein the white light emitting material is a white light emitting polymer material.

Effect of Invention

The present invention can provide an organic electroluminescent element capable of conveniently and precisely establishing the emission color of the element as a linear function based on the emission color and the mixing ratio of each light emitting material, and a method for manufacturing the same.

EMBODIMENTS FOR CARRYING OUT THE INVENTION

The "CIE 1931 chromaticity coordinate system" used for defining the chromaticity of the emission color in the present invention refers to the XYZ color system that was established by the Commission Internationale de l'Eclairage (abbreviation: CIE) in 1931 as a means for expressing the color by the numerical values.

Figure 1:
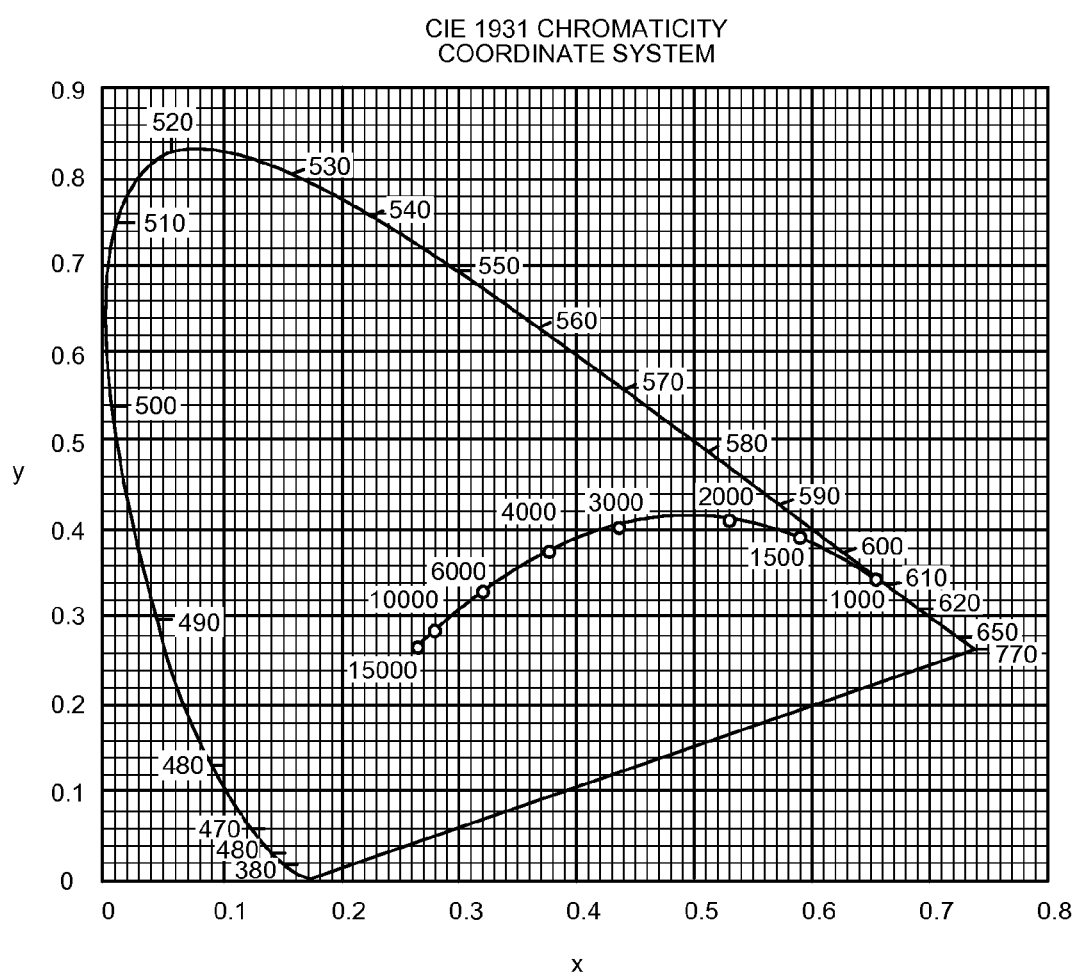
FIG. 1 is a diagram illustrating the CIE 1931 chromaticity coordinate system.

The CIE 1931 chromaticity coordinate system is, as illustrated in FIG. 1, a plane coordinate system in which x is plotted in the abscissa direction and y is plotted in the ordinate direction. In the CIE 1931 chromaticity coordinate system, a monochrome is expressed by a wavelength of the monochromatic spectral line (wavelength range: 380 nm to 770 nm) and a color mixture is expressed by a coordinate (x, y) in a region that is enclosed by the monochromatic spectral line. In the region that is enclosed by the monochromatic spectral line, a locus (blackbody locus) of a color of light emitted by a blackbody (full radiator) and an absolute temperature (color temperature; unit: K) of the blackbody at that time is illustrated.

In the CIE 1931 chromaticity coordinate system, generally, a color mixture region in the vicinity of the monochromatic spectral line at a wavelength of 770 nm represents a red (R) region; a color mixture region in the vicinity of the monochromatic spectral line at a wavelength of 520 nm represents a green (G) region; a color mixture region in the vicinity of the monochromatic spectral line at a wavelength of 380 nm represents a blue (B) region; and a color mixture region in the vicinity of the blackbody locus in a range of color temperatures of 3000 K or more and 11000 K or less represents a white (W) region.

In the present invention, "white" expressed with respect to the emission color refers to a color existing in a region that is distant from the blackbody locus in a range of color temperatures of 3000 K or more and 11000 K or less on the coordinate of CIE 1960 UCS chromaticity diagram (CIE 1960 Luv) by a distance (Δuv) of 0.03 or less.

For example, when a light emitting material 1 containing a light emitting moiety 1 that presents an emission color at the coordinate (x1, y1) in the CIE 1931 chromaticity coordinate system in a concentration (number density of the light emitting moiety per unit weight of the light emitting material) of [c1] and a light emitting material 2 containing a light emitting moiety 2 that presents an emission color at the coordinate (x2, y2) in a concentration of [c2], are used in combination of a weight w1 of the light emitting material 1 with a weight w2 of the light emitting material 2, the color coordinate (Xo, Yo) of the emission color of an organic EL element can be estimated by the following chromaticity relational formulae.

$$Xo = \left(\frac{w1 \cdot [c1]}{w1 \cdot [c1] + w2 \cdot [c2]}\right)x1 + \left(\frac{w2 \cdot [c2]}{w1 \cdot [c1] + w2 \cdot [c2]}\right)x2$$

$$Yo = \left(\frac{w1 \cdot [c1]}{w1 \cdot [c1] + w2 \cdot [c2]}\right)y1 + \left(\frac{w2 \cdot [c2]}{w1 \cdot [c1] + w2 \cdot [c2]}\right)y2$$

[Numerical Formula 2]

Here, $$\frac{w1 \cdot [c1]}{w1 \cdot [c1] + w2 \cdot [c2]} \text{ is}$$

[Numerical Formula 3]

$$1 - \frac{w2 \cdot [c2]}{w1 \cdot [c1] + w2 \cdot [c2]},$$

[Numerical Formula 4]

so that the above chromaticity relational formulae can be converted into the following chromaticity relational formulae.

$$Xo = \left(1 - \frac{w2 \cdot [c2]}{w1 \cdot [c1] + w2 \cdot [c2]}\right)x1 + \left(\frac{w2 \cdot [c2]}{w1 \cdot [c1] + w2 \cdot [c2]}\right)x2$$

$$Yo = \left(1 - \frac{w2 \cdot [c2]}{w1 \cdot [c1] + w2 \cdot [c2]}\right)y1 + \left(\frac{w2 \cdot [c2]}{w1 \cdot [c1] + w2 \cdot [c2]}\right)y2$$

[Numerical Formula 5]

Next, when the chromaticity relational formulae are arranged by assuming a parameter part of $$\frac{w2 \cdot [c2]}{w1 \cdot [c1] + w2 \cdot [c2]}$$

[Numerical Formula 6]

to be m, the chromaticity relational formulae can be further converted into the following chromaticity relational formulae.

$Xo = (x2-x1)m+x1$ $Yo = (y2-y1)m+y1$ [Numerical Formula 7]

Because x1, y1 and [c1] are characteristic values of the light emitting material 1, and x2, y2 and [c2] are characteristic values of the light emitting material 2, the above chromaticity relational formulae are appreciated substantially as a linear function based on the weights w1 and w2 of the light emitting materials.

When the light emitting material 1 and the light emitting material 2 are contained in the same layer, the actual values of the color coordinate of the emission color of the organic EL element are easily deviated from the estimated values of the color coordinate of the emission color obtained by the calculation according to the above chromaticity relational formulae due to an energy transfer between the light emitting moiety 1 of the light emitting material 1 and the light emitting moiety 2 of the light emitting material 2. An influence of such an energy transfer tends to be large when a blue light emitting material and a green light emitting material are used in combination. Particularly, when the objective emission color of the organic EL element is a color mixture of a low chroma or white, even a slight color difference is easily perceived, so that the problem of the color difference becomes remarkable.

The present invention has achieved reduction of such a color difference and convenient and precise establishment of various emission colors.

Hereinafter, the organic EL element and the method for manufacturing the same according to the present invention are described more in detail referring to preferred embodiments thereof.

[Organic EL Element]

<Two-Color Mixed System>

In one embodiment, the organic EL element of the present invention is an organic EL element that comprises a pair of electrodes and a light-emitting layer provided between the electrodes, and presents an emission color at the coordinate Ao (Xo, Yo) in the CIE 1931 chromaticity coordinate system, in which the light-emitting layer comprises in the same layer, a light emitting material A1 that presents an emission color at the coordinate A1 (x1, y1) in the CIE 1931 chromaticity coordinate system and a light emitting material A2 that presents an emission color at the coordinate A2 (x2, y2) in the CIE 1931 chromaticity coordinate system; a distance $L_{Ao\text{-}A1}$ between the coordinates Ao (Xo, Yo) and A1 (x1, y1) in the CIE 1931 chromaticity coordinate system satisfies $L_{Ao\text{-}A1} \leq 0.20$; and a distance $L_{A1\text{-}A2}$ between the coordinates A1 (x1, y1) and A2 (x2, y2) in the CIE 1931 chromaticity coordinate system satisfies $0.13 \leq L_{A1\text{-}A2} \leq 0.35$.

By selecting the light emitting materials A1 and A2 so that the distance $L_{Ao\text{-}A1}$ between the coordinates Ao (Xo, Yo) and A1 (x1, y1) in the CIE 1931 chromaticity coordinate system can satisfy $L_{Ao\text{-}A1} \leq 0.20$ and that the distance $L_{A1\text{-}A2}$ between the coordinates A1 (x1, y1) and A2 (x2, y2) in the CIE 1931 chromaticity coordinate system can satisfy $0.13 \leq L_{A1\text{-}A2} \leq 0.35$, a color difference can be reduced between the actual values of the color coordinate of the emission color of the organic EL element and the estimated values of the color coordinate of the emission color obtained by the calculation according to the above chromaticity relational formulae.

The color coordinate of the emission color of the organic EL element may be varied depending on a difference in the film thickness even when the same light emitting material for the organic EL element is used. Therefore, upon selecting the light emitting materials A1 and A2, it is necessary that all of the element using the light emitting material A1, the element using the light emitting material A2, and the element using the light emitting materials A1 and A2 in combination be fabricated in the same film thickness and that the coordinate Ao, the coordinate A1, and the coordinate A2, which are obtained by measuring the emission colors of the elements be set as reference values.

The measurement of the color coordinate can be performed according to the method described below in Examples.

From the viewpoint of reducing the color difference, the distance $L_{Ao\text{-}A1}$ between the coordinates Ao (Xo, Yo) and A1 (x1, y1) satisfies preferably $L_{Ao\text{-}A1} \leq 0.19$, and more preferably $L_{Ao\text{-}A1} \leq 0.17$. When the distance $L_{Ao\text{-}A1}$ satisfies $L_{Ao\text{-}A1} \leq 0.10$, the emission color of the organic EL element can be easily fine-adjusted, which is particularly advantageous when the objective emission color of the organic EL element is a color mixture of a low chroma or white.

From the viewpoint of reducing the color difference, the distance $L_{A1\text{-}A2}$ between the coordinates A1 (x1, y1) and A2 (x2, y2) satisfies preferably $0.13 \leq L_{A1\text{-}A2} \leq 0.30$, and more preferably $0.13 \leq L_{A1-A2} \leq 0.25$. When the distance $L_{A1-A2}$ satisfies $0.13 \leq L_{A1-A2} \leq 0.20$, the emission color of the organic EL element can be easily fine-adjusted, which is particularly advantageous when the objective emission color of the organic EL element is a color mixture of a low chroma or white.

As the light emitting materials A1 and A2, so long as the light emitting materials A1 and A2 satisfy the above conditions for the distance $L_{Ao-A1}$ and the distance $L_{A1-A2}$, any light emitting material may be used; any of a phosphorescent light emitting material and a fluorescent light emitting material may be used; and any of a light emitting material of low molecular type and a light emitting material of polymer type may be used. As the light emitting material A1, so long as the light emitting material A1 presents the emission color at the coordinate A1 (x1, y1) in the CIE 1931 chromaticity coordinate system, one type of light emitting material may be singly used or two or more types of light emitting material may be used in a mixture thereof. Similarly, as the light emitting material A2, so long as the light emitting material A2 presents an emission color at the coordinate A2 (x2, y2) in the CIE 1931 chromaticity coordinate system, one type of light emitting material may be singly used or two or more types of light emitting material may be used in a mixture thereof. When as the light emitting material A1, two or more types of light emitting material are used in a mixture thereof, the concentration of the light emitting moiety in the light emitting material A1 may be obtained by weighted-averaging the concentrations of the light emitting moieties in the light emitting materials contained in the mixture. The concentration of the light emitting moiety in the light emitting material A2 when as the light emitting material A2, two or more types of light emitting material are used in a mixture thereof may also be obtained in the same manner as described above.

Examples of the light emitting material for light in each color are illustrated below. Even light emitting materials having the same skeleton structure can present different emission colors depending on the side chains bonded to the skeleton structure, so that the exemplifications below serve as a rough guide.

As the red (R) light emitting material, any of a phosphorescent red light emitting material and a fluorescent red light emitting material may be used.

Examples of the phosphorescent red light emitting material may include metal complexes in which three bidentate ligands coordinate with a metal atom. Examples of such a metal complex may include tris(phenylisoquinoline) iridium (III). The metal complex may have a substituent such as an alkyl group and an alkoxy group. The phosphorescent red light emitting material may form a core portion of a dendrimer surrounded by one or more dendron(s). The dendron is preferably a conjugated dendron and has preferably a surface group for solubilizing the dendrimer.

Examples of the fluorescent red light emitting material may include coumarin derivatives, thiophene ring compounds, oxadiazole derivatives, thiadiazole derivatives, and oligomers and polymers thereof; poly-p-phenylenevinylene derivatives; polythiophene derivatives; polyfluorene derivatives; and the like.

When as the red light emitting material, a red light emitting polymer material is used, the red light emitting polymer material may contain besides a structural unit containing a light emitting moiety (light emitting structural unit), a non-light emitting structural unit such as a structural unit exhibiting electric charge transport property. Examples of the non-light emitting structural unit may include structural units exhibiting electric charge transport property derived from fluorene derivatives.

Examples of the green (G) light emitting material may include quinacridone derivatives, coumarin derivatives, and polymers thereof; poly-p-phenylenevinylene derivatives; polyfluorene derivatives; and the like.

When as the green light emitting material, a green light emitting polymer material is used, the green light emitting polymer material may contain besides a structural unit containing a light emitting moiety (light emitting structural unit), a non-light emitting structural unit such as a structural unit exhibiting electric charge transport property. Examples of the non-light emitting structural unit may include structural units exhibiting electric charge transport property derived from fluorene derivatives.

Examples of the blue (B) light emitting material may include compounds having a structure in which two or more aromatic carbon rings are fused and compounds having a heterocyclic structure.

Examples of the structure in which two or more aromatic carbon rings are fused may include a naphthalene skeleton, an anthracene skeleton, a phenanthrene skeleton, a triphenylene skeleton, a chrysene skeleton, a fluoranthene skeleton, a benzofluoranthene skeleton, a pyrene skeleton, a perylene skeleton, and the like.

Other examples of the blue light emitting material may include distyrylarylene derivatives, oxadiazole derivatives and polymers thereof; polyvinylcarbazole derivatives; poly-p-phenylene derivatives; polyfluorene derivatives; and the like.

When as the blue light emitting material, a blue light emitting polymer material is used, the blue light emitting polymer material may contain besides a structural unit containing a light emitting moiety (light emitting structural unit), a non-light emitting structural unit such as a structural unit exhibiting electric charge transport property. Examples of the non-light emitting structural unit may include structural units exhibiting electric charge transport property derived from fluorene derivatives.

As the white (W) light emitting material, a mixed white light emitting material prepared by mixing two or more materials emitting light in each color of blue-purple, blue, blue-green, green, yellow-green, yellow, orange, and red may be used or a white light emitting polymer material containing a plurality of light emitting moieties emitting light in each color in the molecule thereof may be used.

As the light emitting material usable for the mixed white light emitting material, any of a light emitting material of low molecular type and a light emitting material of polymer type may be used. By mixing a light emitting material of polymer type and a light emitting material of low molecular type, the mixed white light emitting material may be formed.

When the mixed white light emitting material is formed by mixing two types of light emitting material, it is preferred to mix two types of light emitting material that present emission colors in the relation of the complementary color with each other. Examples of the combination of two types of light emitting material that present emission colors in the relation of the complementary color with each other may include a combination of a blue light emitting material and a yellow or orange light emitting material and a combination of a blue-green light emitting material and a red light emitting material.

Upon forming the mixed white light emitting material, it is preferred to mix a light emitting material of polymer type that presents an emission color other than white and a light emitting material of low molecular type that presents an emission color other than the above emission color that the light emitting material of polymer type presents. Three or more types of light emitting material may be mixed to form the mixed white light emitting material.

As the white light emitting material, a white light emitting polymer material containing a plurality of light emitting moieties emitting light in each of colors from blue-purple to red in the molecule thereof may be used. The white light emitting polymer material contains in the molecule thereof, at least two types of light emitting moiety. The light emitting moiety may be any of a phosphorescent light emitting moiety and a fluorescent light emitting moiety. The light emitting moiety may be a portion of the main chain of a polymer or a portion of a side chain group of a polymer.

When the white light emitting polymer material contains two types of light emitting moiety, the white light emitting polymer material contains preferably two types of light emitting moiety that present emission colors in the relation of the complementary color with each other. Examples of the combination of two types of light emitting moiety that present emission colors in the relation of the complementary color with each other may include a combination of a blue light emitting moiety and a yellow or orange light emitting moiety and a combination of a blue-green light emitting moiety and a red light emitting moiety.

When the white light emitting polymer material contains three types of light emitting moiety, the white light emitting polymer material contains preferably a blue light emitting moiety, a green light emitting moiety, and a red light emitting moiety.

The white light emitting polymer material may contain also four or more types of light emitting moiety.

The light emitting moiety usable as the light emitting moiety of the white light emitting polymer material is exemplified below. Although the exemplification below is performed with the name of the compound, when the light emitting moiety is contained in the main chain of the white light emitting polymer material, the light emitting moiety exists as a divalent group derived from the compound and when the light emitting moiety is contained in side chains or at a terminal of the main chain, the light emitting moiety exists as a monovalent group derived from the compound.

Examples of the light emitting moiety contained in the white light emitting polymer material may include a dye-type light emitting moiety, a metal-complex-type light emitting moiety, and a conjugated-polymer-type light emitting moiety.

Examples of the dye-type light emitting moiety may include cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, quinacridone derivatives, coumarin derivatives, and the like.

Examples of the metal-complex-type light emitting moiety may include metal complexes having a central metal such as a rare earth metal (Ir, Pt, Tb, Eu, Dy, and the like), Al, Zn, and Be and having a ligand such as oxadiazole, thiadiazole, phenylpyridine, phenylbenzimidazole, and quinoline structures. Preferred examples of the metal-complex-type light emitting moiety may include metal complexes emitting light from a triplet excited state such as iridium complexes and platinum complexes; aluminum-quinolinol complexes; benzoquinolinol-beryllium complexes; benzoxazolyl-zinc complexes; benzothiazole-zinc complexes; azomethyl-zinc complexes; porphyrin-zinc complexes; phenanthroline-europium complexes; and the like.

Examples of the conjugated-polymer-type light emitting moiety may include poly-p-phenylenevinylene derivatives, polythiophene derivatives, poly-p-phenylene derivatives, polysilane derivatives, polyacetylene derivatives, polyfluorene derivatives, polyvinylcarbazole derivatives, and the like.

The white light emitting polymer material may contain besides a structural unit containing a light emitting moiety (light emitting structural unit), a non-light emitting structural unit such as a structural unit exhibiting electric charge transport property. Examples of the non-light emitting structural unit may include structural units exhibiting electric charge transport property derived from fluorene derivatives.

In the present invention, the light emitting material A1 is preferably a white light emitting material. By using a white light emitting material as the light emitting material A1, fine adjustment of the color coordinate Ao (Xo, Yo) in a white region can be easily and precisely performed.

The light emitting material A2 used in combination with the light emitting material A1 is preferably a light emitting material that presents an emission color other than white. By using a white light emitting material as the light emitting material A1, and using a light emitting material that presents an emission color other than white as the light emitting material A2, fine adjustment of the color coordinate Ao (Xo, Yo) can be easily and precisely performed also in a color mixture region of a low chroma.

In the present invention, the light emitting material A1 is more preferably a white light emitting polymer material. The white light emitting polymer material contains in a polymer chain (one molecule), a plurality of light emitting moieties having different light emission wavelengths each in a specific content. Therefore, in comparison with the use of a mixed white light emitting material, which requires strict control on the mixing ratio of a plurality of light emitting materials, the light emitting material A1 that presents the emission color at the color coordinate A1 (x1, y1) can be precisely achieved. When the mixed white light emitting material is used for obtaining a light emitting material A1 that presents the emission color at the color coordinate A1 (x1, y1), it has the problem of color difference.

<Three-Color Mixed System>

The organic EL element of the present invention may comprise in the same layer, in addition to the light emitting materials A1 and A2, a light emitting material A3 that presents an emission color at the color coordinate A3 (x3, y3) in the CIE 1931 chromaticity coordinate system. In the present embodiment, when a color coordinate of an emission color by the sum of the light emitting materials A1 and A2 is assumed to be Ad (xd, yd), a distance $L_{Ad\text{-}A3}$ between the coordinates Ad (xd, yd) and A3 (x3, y3) in the CIE 1931 chromaticity coordinate system satisfies $0.13 \leq L_{Ad\text{-}A3} \leq 0.35$.

The conditions for the distance $L_{Ao\text{-}A1}$ between the coordinates Ao and A1 and the distance $L_{A1\text{-}A2}$ between the coordinates A1 and A2 are the same as described above in <Two-color mixed system>.

When a color coordinate of an emission color by the sum of the light emitting materials A1 and A2 is assumed to be Ad (xd, yd), by selecting the light emitting materials A1, A2 and A3 so that a distance $L_{Ad\text{-}A3}$ between the coordinates Ad (xd, yd) and A3 (x3, y3) in the CIE 1931 chromaticity coordinate system can satisfy $0.13 \leq L_{Ad\text{-}A3} \leq 0.35$, a color difference can be reduced between the actual values of the color coordinate of the emission color of the element and the estimated values of the color coordinate of the emission color obtained by the calculation according to the above chromaticity relational formulae.

In the present embodiment in which in addition to the light emitting materials A1 and A2, the light emitting material A3 is used, the weight w1 in the above chromaticity relational formulae may be obtained as the total weight of the light emitting materials A1 and A2 and the concentration [c1] may be obtained by weighted-averaging the concentration of the light emitting moiety in the light emitting material A1 and the concentration of the light emitting moiety in the light emitting material A2.

From the viewpoint of reducing the color difference, the distance $L_{Ad-A3}$ between the coordinates Ad (xd, yd) and A3 (x3, y3) satisfies preferably $0.13 \le L_{Ad-A3} \le 0.30$, and more preferably $0.13 \le L_{Ad-A3} \le 0.25$. When the distance $L_{Ad-A3}$ satisfies $0.13 \le L_{Ad-A3} \le 0.20$, the emission color of the organic EL element can be easily fine-adjusted, which is particularly advantageous when the objective emission color of the organic EL element is a color mixture of a low chroma or white.

As the light emitting materials A1, A2 and A3, any light emitting material may be used so long as the light emitting materials A1, A2 and A3 satisfy the above conditions for the distance $L_{Ao-A1}$, the distance $L_{A1-A2}$, and the distance $L_{Ad-A3}$. As the light emitting material for light in each color, the same light emitting material as the light emitting material for light in each color described above in <Two-color mixed system> may be used. As the light emitting material A3, so long as the light emitting material A3 presents an emission color at the coordinate A3 (x3, y3) in the CIE 1931 chromaticity coordinate system, one type of light emitting material may be singly used or two or more types of light emitting material may be used in a mixture thereof. When two or more types of light emitting material are used in a mixture thereof as the light emitting material A3, the concentration of the light emitting moiety in the light emitting material A3 may be obtained by weighted-averaging the concentrations of the light emitting moieties in each of the light emitting materials contained in the mixture.

Also in the three-color mixed system, the light emitting material A1 is preferably a white light emitting material. By using a white light emitting material as the light emitting material A1, fine adjustment of the color coordinate Ao (Xo, Yo) in a white region can be easily and precisely performed.

The light emitting material A2 used in combination with the light emitting material A1 is preferably a light emitting material that presents an emission color other than white. By using a white light emitting material as the light emitting material A1, and using a light emitting material that presents an emission color other than white as the light emitting material A2, fine adjustment of the color coordinate Ao (Xo, Yo) can be easily and precisely performed also in a color mixture region of a low chroma.

As the light emitting material A3, a light emitting material that presents any emission color may be used so long as the light emitting material A3 satisfies the above condition for the distance $L_{Ad-A3}$. The light emitting material A3 may be selected according to the objective color coordinate Ao (Xo, Yo) of the element.

Also in the three-color mixed system, the light emitting material A1 is more preferably a white light emitting polymer material. The reason for this is the same as the reason described above in <Two-color mixed system>.

In the organic EL element of the present invention, the light-emitting layer may contain components other than the light emitting material (hereinafter, called "other component") in the range without impairing the effect of the present invention. The other component may be of one type or of a plurality of types.

The other component that the light-emitting layer may contain is, from the viewpoint of reducing the driving voltage of the organic EL element, preferably an electric charge transport material.

As the electric charge transport material, a publicly known low molecular compound and a publicly known polymer compound exhibiting electric charge transport property may be used. Among them, the electric charge transport material is preferably a polymer compound exhibiting electric charge transport property. Examples of the polymer compound exhibiting electric charge transport property may include polymer compounds having as a structural unit, one or more type(s) of group(s) selected from the group consisting of an arylene group, a divalent aromatic heterocyclic group, and a divalent aromatic amine residue.

In the organic EL element of the present invention, the total content of the light emitting material in the light-emitting layer is usually 0.01 to 100% by weight, preferably 0.1 to 100% by weight, and more preferably 0.3 to 100% by weight. When the light emitting material is a light emitting polymer material, the total content of the light emitting material in the light-emitting layer is usually 80 to 100% by weight, preferably 90 to 100% by weight, and more preferably 95 to 100% by weight.

When an electric charge transport material is used, the content of the electric charge transport material in the light-emitting layer is preferably 100,000 to 0 parts by weight, preferably 10,000 to 0 parts by weight, when the total weight of the light emitting material is assumed to be 100 parts by weight. When the light emitting material is a light emitting polymer material, the content of the electric charge transport material in the light-emitting layer is preferably 20 to 0 parts by weight, and more preferably 10 to 0 parts by weight.

In the organic EL element of the present invention, the light-emitting layer has a thickness of preferably 1 nm to 1 μm, more preferably 5 nm to 500 nm, and further preferably 10 nm to 200 nm.

[Method for Manufacturing Organic EL Element]
<Two-Color Mixed System>

In one embodiment, the method for manufacturing an organic EL element of the present invention is a method for manufacturing an organic EL element that comprises a pair of electrodes and a light-emitting layer provided between the electrodes and presents an emission color at the coordinate Ao (Xo, Yo) in the CIE 1931 chromaticity coordinate system, the method comprising the step of forming the light-emitting layer by applying an applying liquid comprising a light emitting material A1 that presents an emission color at the coordinate A1 (x1, y1) in the CIE 1931 chromaticity coordinate system, a light emitting material A2 that presents an emission color at the coordinate A2 (x2, y2) in the CIE 1931 chromaticity coordinate system, and a solvent, where a distance $L_{Ao-A1}$ between the coordinates Ao (Xo, Yo) and A1 (x1, y1) in the CIE 1931 chromaticity coordinate system satisfies $L_{Ao-A1} \le 0.20$, and a distance $L_{A1-A2}$ between the coordinates A1 (x1, y1) and A2 (x2, y2) in the CIE 1931 chromaticity coordinate system satisfies $0.13 \le L_{A1-A2} \le 0.35$.

The preferred ranges of the distance $L_{Ao-A1}$ and the distance $L_{A1-A2}$ and the preferred examples of the light emitting materials A1 and A2 are the same as described above.

Examples of the solvent used for the applying liquid may include: a chlorinated solvent such as chloroform, methylene chloride, 1,2-dichloroethane, 1,1,2-trichloroethane, chlorobenzene, and o-dichlorobenzene; an ether solvent such as anisole, tetrahydrofuran, and dioxane; an aromatic hydrocarbon solvent such as benzene, cyclohexylbenzene, toluene, and xylene; an aliphatic hydrocarbon solvent such as cyclohexane, methylcyclohexane, n-pentane, n-hexane, n-heptane, n-octane, n-nonane, and n-decane; a ketone solvent such as acetone, methyl ethyl ketone, and cyclohexanone; an ester solvent such as ethyl acetate, butyl acetate, and ethylcellosolve acetate; a polyhydric alcohol solvent such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1-2-hexanediol; an alcohol solvent such as methanol, ethanol, propanol, 2-propanol, and cyclohexanol; a sulfoxide solvent such as dimethylsulfoxide; and an amide solvent such as N-methyl-2-pyrrolidone and N,N-dimethylformamide.

The method for applying the applying liquid is not particularly limited and examples thereof may include a casting method, a spin coating method, a bar coating method, a blade coating method, a roll coating method, a gravure printing method, a screen printing method, and an inkjet method.

After applying the applying liquid, by drying the applying liquid to distill off the solvent, the light-emitting layer can be formed.

<Three-Color Mixed System>

In the method for manufacturing an organic EL element of the present invention, the light-emitting layer may also be formed by applying an applying liquid comprising in addition to the light emitting materials A1 and A2, further a light emitting material A3 that presents an emission color at the color coordinate A3 (x3, y3) in the CIE 1931 chromaticity coordinate system. In the present embodiment, when a color coordinate of an emission color by the sum of the light emitting materials A1 and A2 is assumed to be Ad (xd, yd), a distance $L_{Ad-A3}$ between the coordinates Ad (xd, yd) and A3 (x3, y3) in the CIE 1931 chromaticity coordinate system satisfies $0.13 \leq L_{Ad-A3} \leq 0.35$.

The conditions for the distance $L_{Ao-A1}$ between the coordinates Ao and A1 and the distance $L_{A1-A2}$ between the coordinates A1 and A2 are the same as described above in <Two-color mixed system>.

The preferred ranges of the distance $L_{Ao-A1}$, the distance $L_{A1-A2}$, and the distance $L_{Ad-A3}$ and the preferred examples of the light emitting materials A1, A2, and A3 are the same as described above.

In the method for manufacturing an organic EL element of the present invention, the applying liquid may contain components other than the light emitting material ("other component") in the range without impairing the effect of the present invention. The other component may be of one type or of a plurality of types.

The other component that the applying liquid may contain is preferably the above-described electric charge transport material.

In the method for manufacturing an organic EL element of the present invention, the total content of the light emitting material in the applying liquid is usually 0.01 to 100% by weight, preferably 0.1 to 100% by weight, and more preferably 0.3 to 100% by weight, based on the weight of the total solid content during preparing the applying liquid. When the light emitting material is a light emitting polymer material, the total content of the light emitting material in the applying liquid is usually 80 to 100% by weight, preferably 90 to 100% by weight, and more preferably 95 to 100% by weight.

In the present specification, "based on the weight of the total solid content during preparing the applying liquid" mentioned with respect to the content of the light emitting material in the applying liquid means that upon calculating the content of the light emitting material in the applying liquid, the content of the light emitting material is calculated based on the weight of the total solid content used during preparing the applying liquid by excluding the weight of a solvent (the solvent is substantially distilled off in the step of forming the light-emitting layer) used during preparing the applying liquid.

When the electric charge transport material is used, the total content of the electric charge transport material in the applying liquid is preferably 100,000 to 0 parts by weight, and preferably 10,000 to 0 parts by weight, when the total weight of the light emitting material is assumed to be 100 parts by weight. When the light emitting material is a light emitting polymer material, the total content of the electric charge transport material in the applying liquid is preferably 20 to 0 parts by weight, and more preferably 10 to 0 parts by weight.

In the method for manufacturing an organic EL element of the present invention, the formed light-emitting layer has a thickness of preferably 1 nm to 1 µm, more preferably 5 nm to 500 nm, and further preferably 10 nm to 200 nm.

Hereinafter, the configuration examples that the organic EL element of the present invention can take, the configuration of each layer, and the method for forming each layer are described.

The organic EL element of the present invention comprises a pair of electrodes and a light-emitting layer provided between the electrodes as essential components and may include other layer different from the light-emitting layer between the anode and the light-emitting layer and/or between the light-emitting layer and the cathode.

Examples of the layer provided between the cathode and the light-emitting layer may include an electron injection layer, an electron transport layer, a hole block layer, and the like. When both the electron injection layer and the electron transport layer are provided between the cathode and the light-emitting layer, a layer in contact with the cathode refers to the electron injection layer and a layer excluding the electron injection layer refers to the electron transport layer.

The electron injection layer has the function of improving the electron injection efficiency from the cathode. The electron transport layer has the function of improving the electron injection from the cathode or the electron injection layer or the electron transport layer nearer to the cathode.

The hole block layer has the function of blocking the hole transport. When the electron injection layer and/or the electron transport layer have(has) the function of blocking the hole transport, these layers may serve also as the hole block layers.

That the hole block layer has the function of blocking the hole transport can be confirmed, for example, by fabricating an element passing through a hole current alone and confirming the blocking effect from a decrease of the current value thereof.

Examples of the layer provided between the anode and the light-emitting layer may include a hole injection layer, a hole transport layer, an electron block layer, and the like. When both the hole injection layer and the hole transport layer are provided between the anode and the light-emitting layer, a layer in contact with the anode refers to the hole injection layer and a layer excluding the hole injection layer refers to the hole transport layer.

The hole injection layer has the function of improving the hole injection efficiency from the anode. The hole transport layer has the function of improving the hole injection from the anode, the hole injection layer, or the hole transport layer nearer to the anode.

The electron block layer has the function of blocking the electron transport. When the hole injection layer and/or the hole transport layer have(has) the function of blocking the electron transport, these layers may serve also as the electron block layers.

That the electron block layer has the function of blocking the electron transport can be confirmed, for example, by fabricating an element passing through an electron current alone and confirming the effect of blocking the electron transport from a decrease of the current value thereof.

Examples of the layer configuration that the organic EL element can take are as follows:
a) Anode/Light-emitting layer/Cathode
b) Anode/Hole injection layer/Light-emitting layer/Cathode
c) Anode/Hole injection layer/Light-emitting layer/Electron injection layer/Cathode
d) Anode/Hole injection layer/Light-emitting layer/Electron transport layer/Electron injection layer/Cathode
e) Anode/Hole injection layer/Hole transport layer/Light-emitting layer/Cathode
f) Anode/Hole injection layer/Hole transport layer/Light-emitting layer/Electron injection layer/Cathode
g) Anode/Hole injection layer/Hole transport layer/Light-emitting layer/Electron transport layer/Electron injection layer/Cathode
h) Anode/Light-emitting layer/Electron injection layer/Cathode
i) Anode/Light-emitting layer/Electron transport layer/Electron injection layer/Cathode Here, the symbol "/" indicates that the layers between which the symbol "/" is put are stacked adjacent to each other. The same applies to the description below.

The organic EL element containing the above configuration is usually provided on a substrate. The order of the formed layers, the number of the layers, and the thickness of each layer can be appropriately set in view of the luminous efficacy and the life of the organic EL element. Although the organic EL element is usually provided on the substrate with positioning the anode thereof in the substrate side, the organic EL element may be provided on the substrate also with positioning the cathode thereof in the substrate side. For example, when each of the above organic EL elements a) to i) is fabricated on the substrate, in an embodiment of positioning the anode in the substrate side, the layers in the layer order from the anode side (from the left end in each of the above layer configurations a) to i)) are sequentially layered on the substrate, and in an embodiment of positioning the cathode in the substrate side, the layers in the layer order from the cathode (from the right end in each of the above layer configurations a) to i)) are sequentially layered on the substrate. The organic EL element may be a bottom emission type in which light is emitted from the substrate side or a top emission type in which light is emitted from the side opposite to the substrate.

Next, the material and the forming method of each layer in the organic EL element are described more specifically.

<Substrate>

As the substrate, a substrate which is chemically unchanged in the process of manufacturing the organic EL element is preferably used and for example, a glass, a plastic, a polymer film, a silicon plate, and a substrate prepared by layering these substances are used. In the substrate, a driving circuit for driving the organic EL element may be formed beforehand.

<Anode>

In the case of an organic EL element having a configuration in which light emitted from the light-emitting layer is emitted through the anode, an electrode exhibiting optical transparency is used for the anode. As the electrode exhibiting optical transparency, a thin film of a metal oxide, a metal sulfide, a metal, or the like, which has a high electric conductivity can be used. Among them, a thin film having a high light transmittance is preferably used. For example, used is a thin film composed of indium oxide, zinc oxide, tin oxide, ITO, indium zinc oxide (abbreviation: IZO), gold, platinum, silver, copper, or the like, and among them, a thin film composed of ITO, IZO, or tin oxide is preferably used. Examples of the forming method of the anode may include a vacuum deposition method, a sputtering method, an ion plating method, a plating method, and the like. As the anode, a transparent conductive film of an organic substance such as polyaniline or derivatives thereof and polythiophene or derivatives thereof may be used.

For the anode, a light-reflecting material may be used, and as the material, preferred are a metal, a metal oxide, and a metal sulfide, which has the work function of 3.0 eV or more.

The thickness of the anode can be appropriately determined in view of the optical transparency, the electric conductivity, and the like. The thickness of the anode is, for example, 10 nm to 10 µm, preferably 20 nm to 1 µm, and more preferably 50 nm to 500 nm.

<Hole Injection Layer>

Examples of the hole injection material of which the hole injection layer is composed may include: oxides such as vanadium oxide, molybdenum oxide, ruthenium oxide, and aluminum oxide; phenylamine-type compounds; star-burst type amine compounds; phthalocyanine-type compounds; amorphous carbon; polyaniline; and polythiophene derivatives.

Examples of the forming method of the hole injection layer may include film forming from an applying liquid containing the hole injection material. The hole injection layer can be formed by the coating methods described above or a certain publicly known method different from the coating method.

The optimal value of the thickness of the hole injection layer varies depending on the used material and the thickness is appropriately determined in view of required characteristics and easiness of film forming, and the like. The thickness of the hole injection layer is, for example, 1 nm to 1 µm, preferably 2 nm to 500 nm, and more preferably 5 nm to 200 nm.

<Hole Transport Layer>

The hole transport layer that the organic light emitting element of the present invention has contains a hole transport material. The hole transport material is not particularly limited so long as the hole transport material is an organic compound performing the hole transport function. Specific examples of the hole transport material may include polyvinylcarbazole or derivatives thereof, polysilane or derivatives thereof, polysiloxane derivatives having an aromatic amine in a side chain or the main chain thereof, pyrazoline derivatives, arylamine derivatives, stilbene derivatives, triphenyldiamine derivatives, polyaniline or derivatives thereof, polythiophene or derivatives thereof, polypyrrole or derivatives thereof, polyarylamine or derivatives thereof, poly(p-phenylenevinylene) or derivatives thereof, polyfluorene derivatives, polymer compounds having an aromatic amine residue, and poly(2,5-thienylenevinylene) or derivatives thereof.

The hole transport material is preferably a macromolecular compound, for example, a polymer. This is because, when the hole transport material is a polymer compound, film-forming property thereof is enhanced and light emitting property of the organic light emitting element is uniformized. For example, the hole transport material is a polymer having a number average molecular weight in terms of polystyrene of 10,000 or more, preferably $3.0\times10^4$ to $5.0\times10^5$, and more preferably $6.0\times10^4$ to $1.2\times10^5$. The hole transport material is a polymer having a weight average molecular weight in terms of polystyrene of $1.0\times10^4$ or more, preferably $5.0\times10^4$ to $1.0\times10^6$, and more preferably $1.0\times10^5$ to $6.0\times10^5$.

Specific examples of the hole transport material may include the materials disclosed in JP-A-63-70257, JP-A-63-175860, JP-A-02-135359, JP-A-02-135361, JP-A-02-209988, JP-A-03-37992, JP-A-03-152184, and the like.

Among them, the hole transport material is preferably a hole transport polymer material such as polyvinylcarbazole or derivatives thereof, polysilane or derivatives thereof, polysiloxane derivatives having an aromatic amine compound group in a side chain or the main chain thereof, polyaniline or derivatives thereof, polythiophene or derivatives thereof, polyfluorene derivatives, polymer compounds having an aromatic amine residue, poly(p-phenylenevinylene) or derivatives thereof, and poly(2,5-thienylenevinylene) or derivatives thereof; and more preferably polyvinylcarbazole or derivatives thereof, polysilane or derivatives thereof, polysiloxane derivatives having an aromatic amine in a side chain or the main chain thereof, polyfluorene derivatives, or polymer compounds having an aromatic amine residue. When the hole transport material is a low molecular compound, the hole transport material dispersed in a polymer binder is preferably used.

Polyvinylcarbazole or derivatives thereof can be obtained, for example, by cationic polymerization or radical-polymerization of a vinyl monomer.

Examples of polysilane or derivatives thereof may include the compounds described in Chemical Review (Chem. Rev.), vol. 89, p. 1359 (1989) and British Patent No. GB2300196 published specification, and the like. Although the methods described in these literatures can be used for the synthesis method, it is particularly preferred to use the Kipping method.

As polysiloxane or derivatives thereof, because a siloxane skeleton structure hardly exhibits any hole transport property, polysiloxane or derivatives thereof having a structure of a hole transport low molecular material in a side chain or the main chain thereof are preferably used. Particularly preferred are polysiloxane or derivatives thereof having an aromatic amine exhibiting hole transport property in a side chain or the main chain thereof.

The hole transport material is preferably a polymer having a fluoren-diyl group represented by Formula (1). This is because, when the polymer is contacted with an organic compound having a fused ring or a plurality of aromatic rings to prepare the hole transport layer of the organic light emitting element, the hole injection efficiency is enhanced and the current density during driving the organic EL element becomes high.

[Chemical Formula 1]

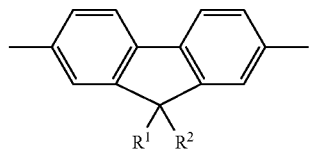

(1)

In Formula (1), R1 and R2 may be the same as or different from each other, and R1 and R2 represent independently a hydrogen atom, an alkyl group, an alkoxy group, an aryl group, or a monovalent heterocyclic group.

Examples of the alkyl group may include a $C_{1-10}$ alkyl group. Examples of the alkoxy group may include a $C_{1-10}$ alkoxy group. Examples of the aryl group may include a phenyl group, a naphthyl group, and the like. Examples of the monovalent heterocyclic group may include a pyridyl group and the like.

The aryl group and the monovalent heterocyclic group may have a substituent. Examples of the substituent may include, from the viewpoint of enhancing the solubility of the hole transport material, a $C_{1-10}$ alkyl group, a $C_{1-10}$ alkoxy group, and the like.

The aryl group and the monovalent heterocyclic group and the substituent thereof may have a crosslinkable group. Examples of the crosslinkable group may include a vinyl group, an ethynyl group, a butenyl group, a group having an acrylic structure, a group having an acrylate structure, a group having an acrylamide structure, a group having a methacrylic structure, a group having a methacrylate structure, a group having a methacrylamide structure, a group having a vinyl ether structure, a vinylamino group, a group having a silanol structure, a group having a small-membered ring (such as cyclopropane, cyclobutane, epoxy, oxetane, diketene, and episulfide), and the like.

Preferred specific examples of the fluoren-diyl group are as follows.

[Chemical Formula 2]

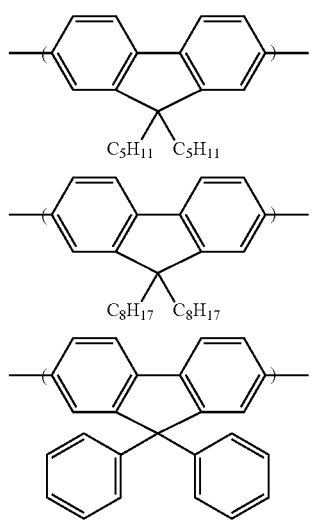

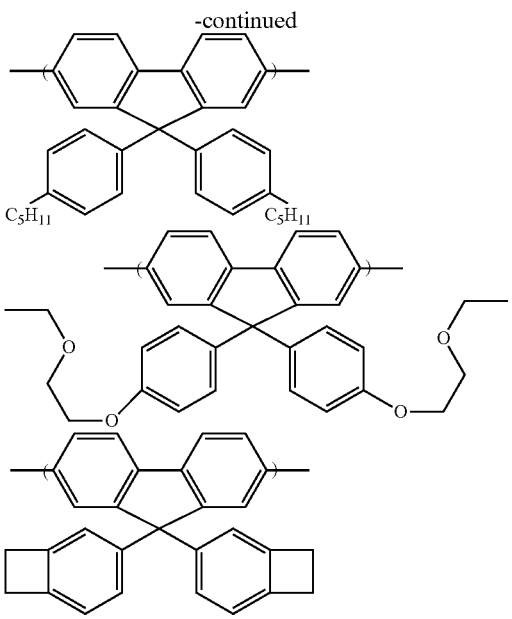

A particularly preferred hole transport material is a polymer containing the above fluoren-diyl group and a structure of an aromatic tertiary amine compound as a repeating unit, for example, a polyarylamine-type polymer.

Examples of the repeating unit containing a structure of an aromatic tertiary amine compound may include a repeating unit represented by Formula (2) below.

[Chemical Formula 3]

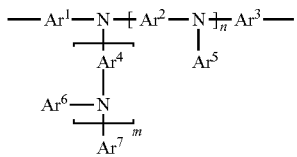

(2)

In Formula (2), $Ar^1$, $Ar^2$, $Ar^3$, and $Ar^4$ represent independently an arylene group or a divalent heterocyclic group. $Ar^5$, $Ar^6$, and $Ar^7$ represent independently an aryl group or a monovalent heterocyclic group. Alternatively, instead of representing the above groups, $Ar^6$ and $Ar^7$ may form a ring together with the nitrogen atom to which $Ar^6$ and $Ar^7$ are bonded. m and n represent independently 0 or 1.

Examples of the arylene group may include a phenylene group and the like, and examples of the divalent heterocyclic group may include a pyridine-diyl group and the like. These groups may have a substituent.

Examples of the aryl group may include a phenyl group, a naphthyl group, and the like. Examples of the monovalent heterocyclic group may include a thienyl group, a furyl group, a pyridyl group, and the like. These groups may have a substituent.

The substituent that the arylene group, the aryl group, the divalent heterocyclic group, and the monovalent heterocyclic group may have is, from the viewpoint of the solubility of the hole transport material, preferably an alkyl group, an alkoxy group, or an aryl group, and more preferably an alkyl group. Examples of the alkyl group may include a $C_{1-10}$ alkyl group. Examples of the alkoxy group may include a $C_{1-10}$ alkoxy group. Examples of the aryl group may include a phenyl group, a naphthyl group, and the like.

The substituent may have a crosslinkable group. Examples of the crosslinkable group may include a vinyl group, an ethynyl group, a butenyl group, a group having an acrylic structure, a group having an acrylate structure, a group having an acrylamide structure, a group having a methacrylic structure, a group having a methacrylate structure, a group having a methacrylamide structure, a group having a vinyl ether structure, a vinylamino group, a group having a silanol structure, a group having a small-membered ring (such as cyclopropane, cyclobutane, epoxy, oxetane, diketene, and episulfide), and the like.

$Ar^1$, $Ar^2$, $Ar^3$, and $Ar^4$ are preferably an arylene group, and more preferably a phenylene group. $Ar^5$, $Ar^6$, and $Ar^7$ are preferably an aryl group, and more preferably a phenyl group.

Furthermore, a carbon atom in $Ar^2$ and a carbon atom in $Ar^3$ may be bonded with each other either directly or through a divalent group such as —O— and —S—.

From the viewpoint of easiness of synthesis of the monomer, m and n are preferably 0.

Specific examples of the repeating unit represented by Formula (2) may include the following repeating units and the like.

[Chemical Formula 4]

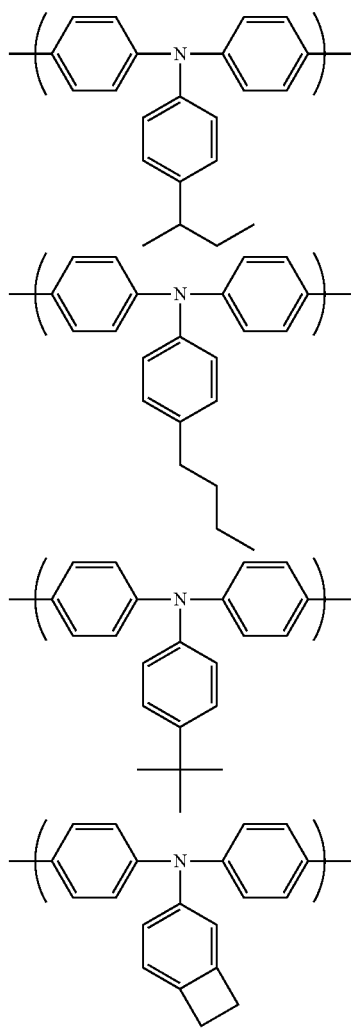

-continued

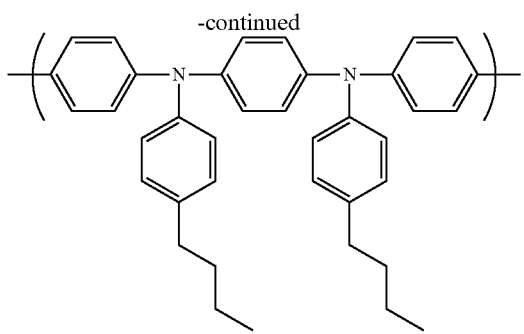

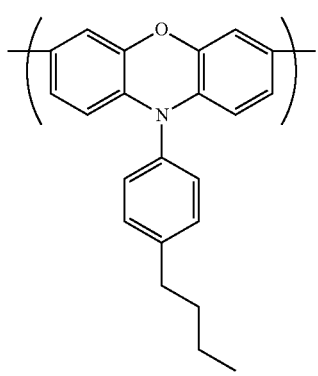

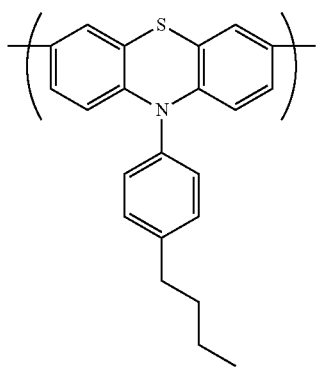

The method for forming the hole transport layer is not limited. When the hole transport material is a low molecular compound, examples of the method for forming the hole transport layer may include a method by film forming from a mixed solution of the low molecular compound and a polymer binder. When the hole transport material is a polymer compound, examples of the method for forming the hole transport layer may include a method by film forming from a solution of the polymer compound.

The solvent used for the method by film forming from a solution is not particularly limited so long as the solvent can dissolve the hole transport material. Examples of the solvent may include: a chlorinated solvent such as chloroform, methylene chloride, and dichloroethane; an ether solvent such as tetrahydrofuran; an aromatic hydrocarbon solvent such as toluene and xylene; a ketone solvent such as acetone and methyl ethyl ketone; and an ester solvent such as ethyl acetate, butyl acetate, and ethylcellosolve acetate.

Examples of the method by film forming from a solution may include a coating method such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, and an inkjet printing method.

The polymer binder preferably does not extremely impair the electric charge transport. In addition, a polymer binder that does not strongly absorb visible light is preferably used. Examples of the polymer binder may include polycarbonate, polyacrylate, polymethylacrylate, polymethylmethacrylate, polystyrene, polyvinyl chloride, polysiloxane, and the like.

The optimal value of the thickness of the hole transport layer varies depending on the used material. The thickness may be selected so that the driving voltage and the luminous efficacy will be moderate values. The layer needs to be thick enough to cause no pin hole. When the layer is too thick, the driving voltage of the element becomes high, which is not preferred. The thickness of the hole transport layer is, for example 1 nm to 1 μm, preferably 2 nm to 500 nm, and more preferably 5 nm to 200 nm.

<Electron Transport Layer>

As the electron transport material of which the electron transport layer is composed, a publicly known material may be used. Examples of the electron transport material of which the electron transport layer is composed may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or derivatives thereof, polyquinoline or derivatives thereof, polyquinoxaline or derivatives thereof, polyfluorene or derivatives thereof, and the like.

Among them, as the electron transport material, oxadiazole derivatives, benzoquinone or derivatives thereof, anthraquinone or derivatives thereof, metal complexes of 8-hydroxyquinoline or derivatives thereof, polyquinoline or derivatives thereof, polyquinoxaline or derivatives thereof, and polyfluorene or derivatives thereof are preferred, and 2-(4-biphenylyl)-5-(4-tert-butylphenyl)-1,3,4-oxadiazole, benzoquinone, anthraquinone, tris(8-quinolinol) aluminum, and polyquinoline are more preferred.

The method for forming the electron transport layer is not particularly limited. Examples of the method for forming the electron transport layer when an electron transport low molecular material is used may include a vacuum deposition method from a powder and a method by film forming from a solution state or a molten state. Examples of the method for forming the electron transport layer when an electron transport polymer material is used may include a method by film forming from a solution state or a molten state. When film forming from a solution state or a molten state is performed, a polymer binder may be further used in combination. The electron transport layer can be formed by a certain publicly known method.

The optimal value of the thickness of the electron transport layer varies depending on the used material and the thickness is appropriately determined in view of required characteristics and easiness of film forming, and the like. The thickness of the electron transport layer is, for example, 1 nm to 1 μm, preferably 2 nm to 500 nm, and more preferably 5 nm to 200 nm.

<Electron Injection Layer>

As the material of which the electron injection layer is composed, an optimal material is appropriately selected according to the type of the light-emitting layer. Examples of the material of which the electron injection layer is composed may include an alkali metal, an alkaline earth metal, an alloy containing one or more type(s) of an alkali metal and an alkaline earth metal, an oxide, a halide, or a carbonate of an alkali metal or an alkaline earth metal, a mixture of these substances, and the like. Examples of the alkali metal and the oxide, the halide, and the carbonate of the alkali metal may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. Examples of the alkaline earth metal and the oxide, the halide, and the carbonate of the alkaline earth metal may include magnesium, calcium, barium, strontium, magnesium oxide, magnesium fluoride, calcium oxide, calcium fluoride, barium oxide, barium fluoride, strontium oxide, strontium fluoride, magnesium carbonate, and the like. The electron injection layer may include a layered body prepared by layering two or more layers and examples thereof may include LiF/Ca and the like. The electron injection layer may be formed by a certain publicly known method such as a deposition method, a sputtering method, and a printing method. The thickness of the electron injection layer is preferably around 1 nm to around 1 μm.

<Cathode>

The material for the cathode is preferably a material having a small work function, capable of easily injecting electrons into the light-emitting layer, and having a high electric conductivity. In an organic EL element in which light is taken out from the anode side, it is preferred for enhancing the luminous efficacy that light emitted from the light-emitting layer is reflected at the cathode toward the anode side. Therefore, the material for the cathode is preferably a material having a high visible-light reflectivity. Examples of the material for the cathode may include an alkali metal, an alkaline earth metal, a transition metal, a metal of Group 13 in the Periodic Table, and the like. As the material for the cathode, for example, used are metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more types among the above metals; alloys of one or more type(s) of the above metals with one or more type(s) of gold, silver, platinum, copper, manganese, titanium, cobalt, nickel, tungsten, and tin; and graphite and graphite intercalation compounds; or the like. Examples of the alloy may include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like. As the cathode, a transparent conductive electrode consisting of a conductive metal oxide or a conductive organic substance or the like may be used. Specific examples of the conductive metal oxide may include indium oxide, zinc oxide, tin oxide, ITO, and IZO and specific examples of the conductive organic substance may include polyaniline or derivatives thereof, polythiophene or derivatives thereof, and the like. The cathode may include a layered body prepared by layering two or more layers. The electron injection layer may be used as the cathode.

The thickness of the cathode is appropriately set in view of the electric conductivity and the durability. The thickness of the cathode is, for example, 10 nm to 10 μm, preferably 20 nm to 1 μm, and more preferably 50 nm to 500 nm. Examples of the method for forming the cathode may include a vacuum deposition method, a sputtering method, a laminate method in which a metal thin film is thermocompressed and bonded, and the like.

The above-described organic EL element can be suitably used for a curved or planar illumination device, for example, a planar light source used as a light source for a scanner, and a display device.

Examples of the display device containing the organic EL element may include a segment display device, a dot-matrix display device, and the like. The dot-matrix display device includes an active matrix display device, a passive matrix display device, and the like. The organic EL element is used as a light emitting element constituting each pixel in the active matrix display device or the passive matrix display device. In addition, the organic EL element is used in the segment display device as a light emitting element constituting each segment or a backlight, or is used as a backlight in a liquid crystal display device.

EXAMPLES

Hereinafter, the present invention will be described more in detail referring to Example which should not be construed as limiting the scope of the present invention.

The alkyl group in the chemical structural formula described in the present Example is usually a linear alkyl group.

The number average molecular weight and the weight average molecular weight were obtained by size exclusion chromatography (SEC) as a number average molecular weight and a weight average molecular weight in terms of polystyrene. SEC in which the mobile phase is an organic solvent is called gel permeation chromatography (GPC). The analysis conditions for GPC were as follows.

The measurement sample was dissolved in tetrahydrofuran in a concentration of about 0.05% by weight and 10 μL of the sample solution was injected into GPC (manufactured by Shimadzu Corporation; trade name: LC-10Avp). As the mobile phase of GPC, tetrahydrofuran (flow rate: 2.0 mL/min) was used. As the column, PLgel MIXED-B (manufactured by Polymer Laboratories Ltd.) was used. As the detector, a UV-VIS detector (manufactured by Shimadzu Corporation; trade name: SPD-10Avp) was used.

The measurement of the light-emitting spectrum of the polymer materials used in Examples and Comparative Examples was performed as follows. A solution prepared by dissolving the polymer material as the measurement sample in xylene was applied onto a quartz substrate using a spin coating method. The application was performed by adjusting the solution concentration and the conditions for spin coating so that a polymer material film having a thickness of about 60 nm could be obtained. As the device for measuring the light-emission spectrum, Fluorescence Spectrometer (manufactured by JASCO Corporation; MODEL: FP-6500) was used.

Measuring Method of CIE 1931 Chromaticity Coordinate

The CIE 1931 chromaticity coordinate of an emission color of the organic EL elements fabricated in Examples and Comparative Examples was measured using Display Color Analyzer CM210A (manufactured by Konica Minolta, Inc.).

The light-emitting layer of the organic EL elements in Examples and Comparative Examples were fabricated so as to have the same thickness (65 nm).

With respect to the blue light emitting polymer material, the green light emitting polymer material, and the white light emitting polymer material used in Examples and Comparative Examples, the concentrations of the light emitting moiety in the light emitting material were substantially the same as each other.

Preparation Example 1

Preparation of Applying Liquid B

Blue Light Emitting Polymer Material:

The blue light emitting polymer material was prepared by polymerization using the Suzuki polymerization method. The constitutional units of the obtained blue light emitting polymer material and the molar ratio of each constitutional unit are illustrated in Table 1. The molar ratio was calculated based on the charging ratio. The obtained blue light emitting polymer material had a weight average molecular weight (Mw) of $2.29 \times 10^5$ in terms of polystyrene. The light-emission spectrum of the obtained blue light emitting polymer material was measured, and the light emitting peak wavelength thereof was 461 nm.

Next, the blue light emitting polymer material was dissolved in a solvent mixture of anisole and cyclohexylbenzene (weight ratio 1:1) to prepare an applying liquid B (concentration of blue light emitting polymer material: 1.2% by weight).

TABLE 1

| Constitutional unit | structure 1 | structure 2 | structure 3 |
|---|---|---|---|
| Molar ratio | 50 | 32 | 10 |

| Constitutional unit | structure 4 | structure 5 |
|---|---|---|
| Molar ratio | 3 | 5 |

Preparation Example 2

Preparation of Applying Liquid G

Green Light Emitting Polymer Material:

The green light emitting polymer material was prepared by polymerization using the Suzuki polymerization method. The constitutional units of the obtained green light emitting polymer material and the molar ratio of each constitutional unit are illustrated in Table 2. The molar ratio was calculated based on the charging ratio. The obtained green light emitting polymer material had Mw of $2.35 \times 10^5$ in terms of polystyrene. The light-emission spectrum of the obtained green light emitting polymer material was measured, and the light emission peak wavelength thereof was 515 nm.

Next, the green light emitting polymer material was dissolved in a solvent mixture of anisole and cyclohexylbenzene (weight ratio 1:1) to prepare an applying liquid G (concentration of green light emitting polymer material: 1.2% by weight).

Preparation Example 3

Preparation of Applying Liquid 3

The applying liquid B and the applying liquid G were mixed in a weight ratio of 99:1 to prepare an applying liquid B99G1.

Preparation Example 4

Preparation of Applying Liquid B97G3

The applying liquid B and the applying liquid G were mixed in a weight ratio of 97:3 to prepare an applying liquid B97G3.

TABLE 2

| Constitutional unit | | |
|---|---|---|
| 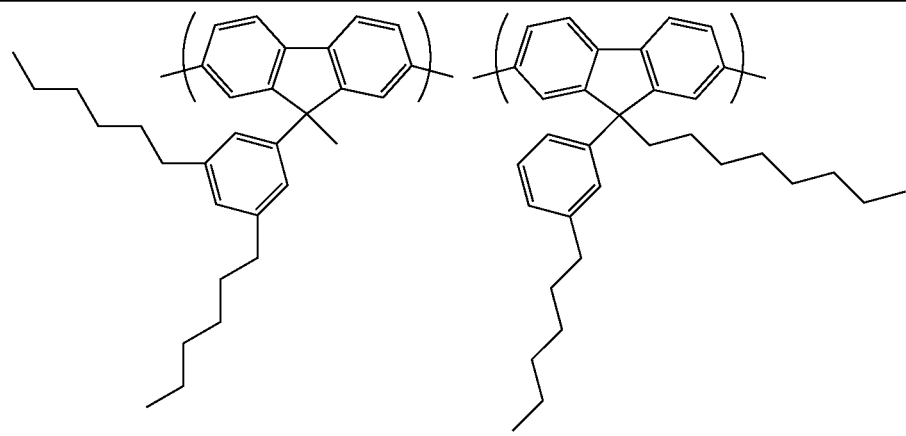 | | |
| Molar ratio | 50 | 44 |
| Constitutional unit | 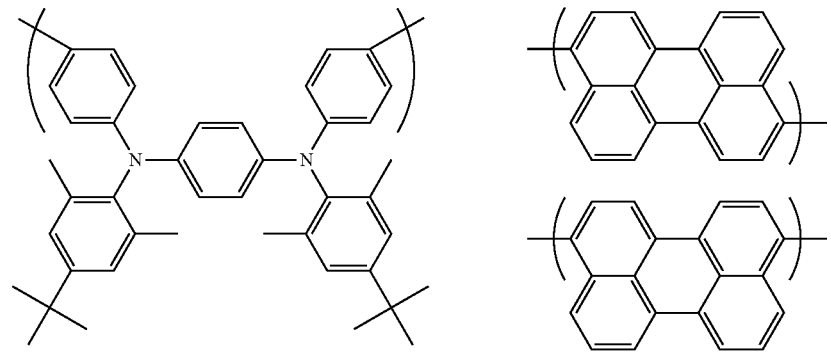 | |
| | | The structural unit has a structural isomer* |
| Molar ratio | 5 | 1 |

*The presence ratio of two types of structural isomer is about 1:1.

Preparation Example 5

Preparation of Applying Liquid B86G14

The applying liquid B and the applying liquid G were mixed in a weight ratio of 86:14 to prepare an applying liquid B86G14.

Preparation Example 6

Preparation of Applying Liquid B73G27

The applying liquid B and the applying liquid G were mixed in a weight ratio of 73:27 to prepare an applying liquid B73G27.

Comparative Example 1

Onto a glass substrate on which an ITO transparent anode was provided, a PEDOT:PSS applying liquid (manufactured by Heraeus Holding GmbH; AI4081) was applied by a slit coating method and was vacuum-dried at 200° C. to form a hole injection layer having a thickness of 60 nm.

Next, a hole transport polymer compound A was dissolved in a solvent mixture of anisole and cyclohexylbenzene (weight ratio 1:1) to prepare a 0.5%-by-weight applying liquid for a hole transport layer. The resultant applying liquid was applied onto the hole injection layer by a spin coating method and was dried in a nitrogen atmosphere at 180° C. for 60 minutes to form a hole transport layer having a thickness of 20 nm.

Six substrates fabricated as described above in which the hole transport layer was formed were prepared. Onto each substrate, the applying liquid B, the applying liquid G, the applying liquid B99G1, the applying liquid B97G3, the applying liquid B86G14, and the applying liquid B73G27 were individually applied by a spin coating method and were dried in a nitrogen atmosphere at 130° C. for 20 minutes to form a light-emitting layer having a thickness of 65 nm.

Then, each of six substrates in which the light-emitting layer was formed was put into a vacuum deposition device and deposited NaF to form an electron injection layer having a thickness of 4 nm. Furthermore, Al was vacuum-deposited to form a cathode having a thickness of 100 nm.

Finally, the substrate on which the layers up to the cathode were formed was encapsulated with a glass sealing substrate using a UV curable resin in a $N_2$ atmosphere to seal the layered structure to fabricate an organic EL element.

By the above-described method, six types of organic EL element corresponding to six types of applying liquid were fabricated.

In Comparative Example 1, the blue light emitting polymer material corresponds to the "light emitting material A1" and the green light emitting polymer material corresponds to the "light emitting material A2".

The obtained six types of organic EL element were driven using a direct current and the CIE 1931 chromaticity coordinate thereof when the organic EL elements emitted light with 300 cd/m² was measured. The measurement results are shown in Table 1. The distance $L_{A1-A2}$ between the coordinates A1 and A2 in the CIE 1931 chromaticity coordinate system was 0.395.

TABLE 3

| | Light emitting material [mixing weight ratio] | | | | | |
|---|---|---|---|---|---|---|
| | A1 | A2 | CIE 1931 chromaticity coordinate | | | |
| Applying liquid | Blue light emitting polymer material | Green light emitting polymer material | Coordinate | CIE-x | CIE-y | $L_{Ao-A1}$ *1 |
| B | 1.00 | 0.00 | A1*2 | 0.160 | 0.214 | — |
| B99G1 | 0.99 | 0.01 | Ao | 0.165 | 0.222 | 0.009 |
| B97G3 | 0.97 | 0.03 | Ao | 0.173 | 0.285 | 0.072 |
| B86G14 | 0.86 | 0.14 | Ao | 0.207 | 0.442 | 0.233 |
| B73G27 | 0.73 | 0.27 | Ao | 0.225 | 0.507 | 0.300 |
| G | 0.00 | 1.00 | A2*2 | 0.262 | 0.596 | — |

*1 Distance between coordinates Ao and A1 in CIE 1931 chromaticity coordinate system
*2 Distance between coordinates A1 and A2 in CIE 1931 chromaticity coordinate system $L_{A1-A2}$ = 0.395

Figure 2:
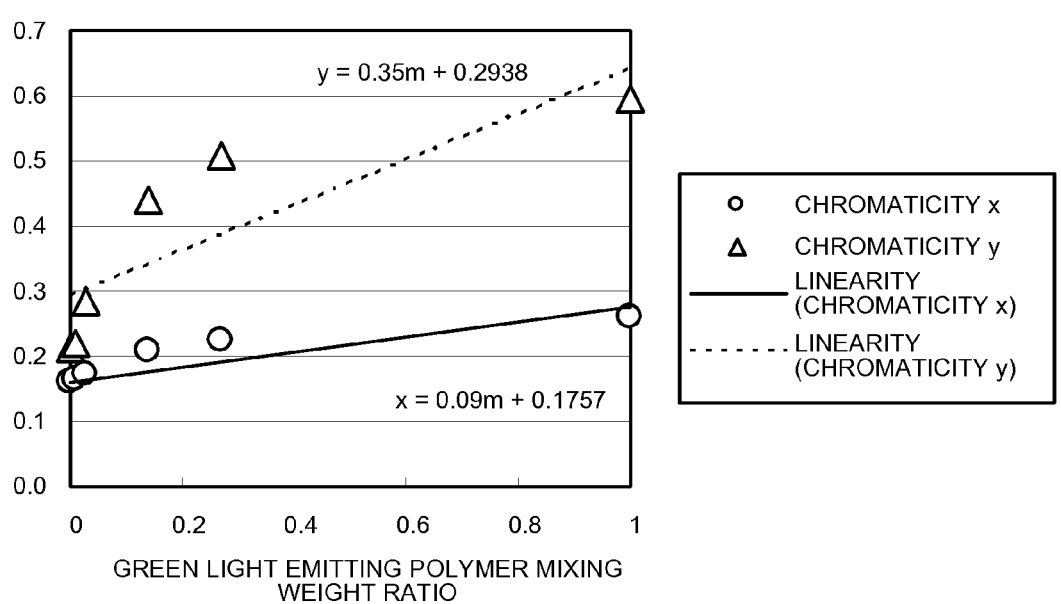
FIG. 2 is a plotted diagram of CIE 1931 chromaticity coordinates x and y for the element of Comparative Example 1.

FIG. 2 illustrates a plotted diagram of CIE 1931 chromaticity coordinates x and y of the emission color of the organic EL element relative to the mixing ratio of the green light emitting polymer material to the blue light emitting polymer material. As described above, the concentration of the light emitting moiety in the blue light emitting polymer material and the concentration of the light emitting moiety in the green light emitting polymer material are substantially the same as each other, so that the parameter part m in the chromaticity relational formulae is appreciated as the mixing weight ratio of the "light emitting material A2". Therefore, on the abscissa in the plotted diagram, the mixing weight ratio of the green light emitting polymer material was plotted. The straight lines in the diagram are approximate straight lines obtained by the least-squares method using the plots of the chromaticity coordinate x and using the plots of the chromaticity coordinate y respectively.

As can be appreciated from FIG. 2, the change in the chromaticity coordinate relative to the mixing weight ratio, particularly the change in the chromaticity coordinate y was poor in linearity and exhibited a large difference from the estimated value based on the chromaticity relational formula. By adding a small amount of the green light emitting polymer material, the chromaticity coordinate y changes significantly, so that it was difficult to establish precisely the emission color of the organic EL element.

Preparation Example 7

Preparation of Applying Liquid W

White Light Emitting Polymer Material:

The white light emitting polymer material was prepared by polymerization using the Suzuki polymerization method. The constitutional units of the obtained white light emitting polymer material and the molar ratio of each constitutional unit are illustrated in Table 3. The molar ratio was calculated based on the charging ratio. Here, the constitutional unit having an Ir complex structure is a structural unit becoming the terminal of the polymer. The obtained white light emitting polymer material had Mw of $2.14 \times 10^5$ in terms of polystyrene. The light-emission spectrum of the obtained white light emitting polymer material was measured, and the light emission peak wavelengths thereof were 466 nm, 515 nm, and 618 nm.

Next, the white light emitting polymer material (color temperature: 5011K, distance from the blackbody locus [$\Delta uv$]: 0.023) was dissolved in a solvent mixture of anisole and cyclohexylbenzene (weight ratio 1:1) to prepare an applying liquid W (concentration of white light emitting polymer material: 1.2% by weight).

TABLE 4

| Constitutional unit | (fluorene with C6H13 and p-C6H13-phenyl substituents) | (fluorene with C8H17 groups) | (fluorene with C6H13 and m-C6H13-phenyl substituents) | (triarylamine with dimethyl-tBu-phenyl groups) |
|---|---|---|---|---|
| Molar ratio | 36 | 14 | 42.8 | 6 |
| Constitutional unit | (phenoxazine with N-phenyl) | (anthracene with methyl and bis(di-(4-tBu-phenyl)amino) substituents) | (Ir complex with phenylisoquinoline ligands and tBu-terphenyl group)₂ | |
| Molar ratio | 1 | 0.1 | 0.1 | |

Preparation Example 8

Preparation of Applying Liquid W90G10

The applying liquid W and the applying liquid G were mixed in a weight ratio of 90:10 to prepare an applying liquid W90G10.

Preparation Example 9

Preparation of Applying Liquid W80G20

The applying liquid W and the applying liquid G were mixed in a weight ratio of 80:20 to prepare an applying liquid W80G20.

Example 1

By the same method as in Comparative Example 1, except that the applying liquid W, the applying liquid G, the applying liquid W90G10, and the applying liquid W80G20 were used, four types of organic EL element were fabricated.

In Example 1, the white light emitting polymer material corresponds to the "light emitting material A1" and the green light emitting polymer material corresponds to the "light emitting material A2".

The obtained four types of organic EL element were driven using a direct current and the CIE 1931 chromaticity coordinate thereof was measured when the organic EL elements emitted light with 300 cd/m². The measurement results are shown in Table 2. The distance $L_{A1-A2}$ between the coordinates A1 and A2 in the CIE 1931 chromaticity coordinate system was 0.327.

was good in linearity and exhibited only a small difference from the estimated value based on the chromaticity relational formulae.

Preparation Example 10

Preparation of Applying Liquid W99B1

The applying liquid W and the applying liquid B were mixed in a weight ratio of 99:1 to prepare an applying liquid W99B1.

Preparation Example 11

Preparation of Applying Liquid W70B30

The applying liquid W and the applying liquid B were mixed in a weight ratio of 70:30 to prepare an applying liquid W70B30.

Preparation Example 12

Preparation of Applying Liquid W60B40

The applying liquid W and the applying liquid B were mixed in a weight ratio of 60:40 to prepare an applying liquid W60B40.

Example 2

By the same method as in Comparative Example 1, except that the applying liquid W, the applying liquid B, the applying liquid W99B1, the applying liquid W70B30 and the applying liquid W60B40 were used, five types of organic EL element were fabricated.

In Example 2, the white light emitting polymer material corresponds to the "light emitting material A1" and the blue light emitting polymer material corresponds to the "light emitting material A2".

The obtained five types of organic EL element were driven using a direct current and the CIE 1931 chromaticity coordinate thereof, when the organic EL elements emitted light with 300 cd/m², was measured. The measurement results are shown in Table 3. The distance $L_{A1-A2}$ between the coordinates A1 and A2 in the CIE 1931 chromaticity coordinate system was 0.186.

TABLE 5

| | Light emitting material [mixing weight ratio] | | | | | |
|---|---|---|---|---|---|---|
| | A1 | A2 | CIE 1931 chromaticity coordinate | | | |
| Applying liquid | White light emitting polymer material | Green light emitting polymer material | Coordinate | CIE-x | CIE-y | $L_{Ao-A1}$*1 |
| W | 1.00 | 0.00 | A1*2 | 0.340 | 0.298 | — |
| W90G10 | 0.90 | 0.10 | Ao | 0.305 | 0.395 | 0.103 |
| W80G20 | 0.80 | 0.20 | Ao | 0.287 | 0.453 | 0.164 |
| G | 0.00 | 1.00 | A2*2 | 0.265 | 0.616 | — |

*1Distance between coordinates Ao and A1 in CIE 1931 chromaticity coordinate system
*2Distance between coordinates A1 and A2 in CIE 1931 chromaticity coordinate system $L_{A1-A2}$ = 0.327

Figure 3:
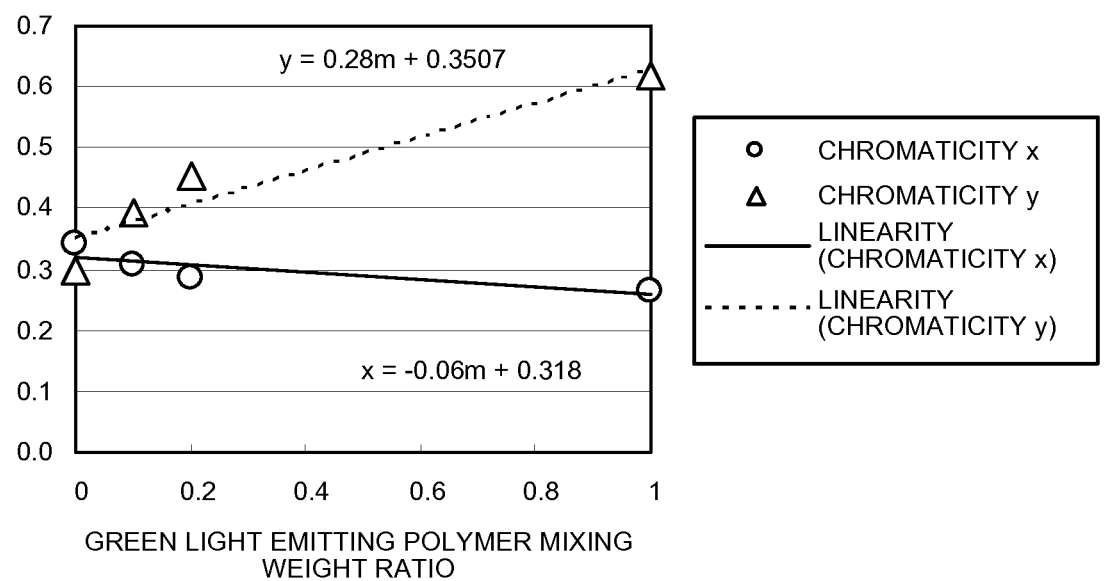
FIG. 3 is a plotted diagram of CIE 1931 chromaticity coordinates x and y for the element of Example 1.

FIG. 3 illustrates a plotted diagram of CIE 1931 chromaticity coordinates x and y of the emission color of the organic EL element relative to the mixing ratio of the green light emitting polymer material to the white light emitting polymer material. As described above, the concentration of the light emitting moiety in the white light emitting polymer material and the concentration of the light emitting moiety in the green light emitting polymer material are substantially the same as each other, so that the parameter part m in the chromaticity relational formulae is appreciated as the mixing weight ratio of the "light emitting material A2". Therefore, on the abscissa in the plotted diagram, the mixing weight ratio of the green light emitting polymer material was plotted.

As can be appreciated from FIG. 3, the change in the chromaticity coordinate relative to the mixing weight ratio

TABLE 6

| Applying liquid | Light emitting material [mixing weight ratio] | | CIE 1931 chromaticity coordinate | | | |
|---|---|---|---|---|---|---|
| | A1 White light emitting polymer material | A2 Blue light emitting polymer material | Coordinate | CIE-x | CIE-y | $L_{Ao-A1}$*[1] |
| W | 1.00 | 0.00 | A1*[2] | 0.340 | 0.298 | — |
| W99B1 | 0.99 | 0.01 | Ao | 0.336 | 0.318 | 0.021 |
| W70B30 | 0.70 | 0.30 | Ao | 0.308 | 0.277 | 0.038 |
| W60B40 | 0.60 | 0.40 | Ao | 0.296 | 0.272 | 0.051 |
| B | 0.00 | 1.00 | A2*[2] | 0.168 | 0.227 | — |

Figure 4:
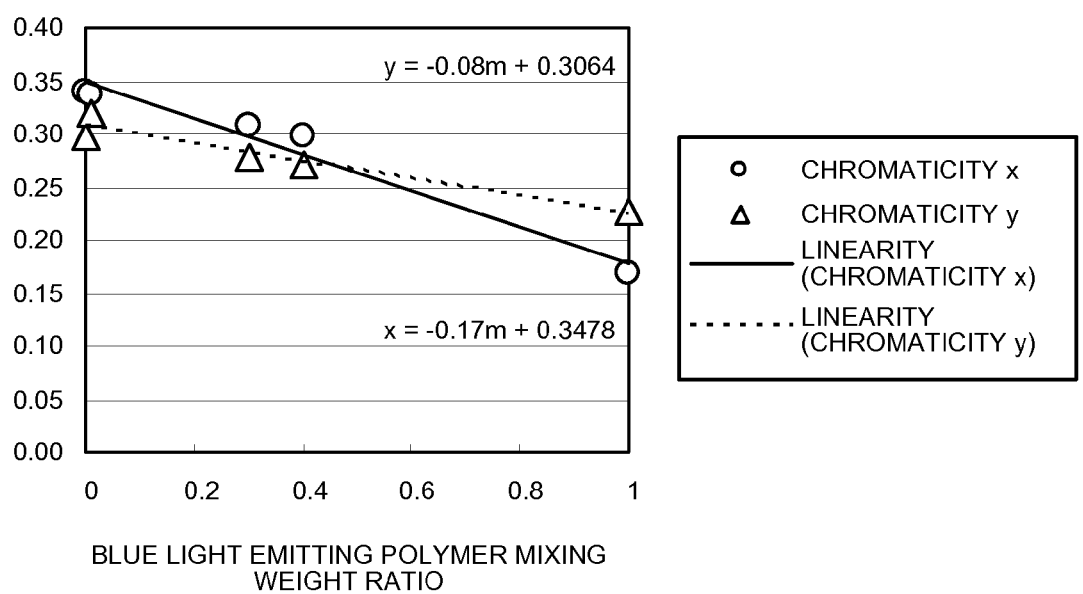
FIG. 4 is a plotted diagram of CIE 1931 chromaticity coordinates x and y for the element of Example 2.

*[1]Distance between coordinates Ao and A1 in CIE 1931 chromaticity coordinate system
*[2]Distance between coordinates A1 and A2 in CIE 1931 chromaticity coordinate system $L_{A1-A2} = 0.186$ FIG. 4 illustrates a plotted diagram of CIE 1931 chromaticity coordinates x and y of the emission color of the organic EL element relative to the mixing ratio of the blue light emitting polymer material to the white light emitting polymer material. As described above, the concentration of the light emitting moiety in the white light emitting polymer material and the concentration of the light emitting moiety in the blue light emitting polymer material are substantially the same as each other, so that the parameter part m in the chromaticity relational formulae is appreciated as the mixing weight ratio of the "light emitting material A2". Therefore, on the abscissa in the plotted diagram, the mixing weight ratio of the blue light emitting polymer material was plotted.

As can be appreciated from FIG. 4, the change in the chromaticity coordinate relative to the mixing weight ratio is excellent in linearity and exhibited only a very small difference from the estimated value based on the chromaticity relational formulae.

Preparation Example 13

Preparation of Applying Liquid W70B30G3

The applying liquid W70B30 and the applying liquid G were mixed in a weight ratio of 97:3 to prepare an applying liquid W70B30G3.

Preparation Example 14

Preparation of Applying Liquid W70B30G6

The applying liquid W70B30 and the applying liquid G were mixed in a weight ratio of 94:6 to prepare an applying liquid W70B30G6.

Preparation Example 15

Preparation of Applying Liquid W70B30G10

The applying liquid W70B30 and the applying liquid G were mixed in a weight ratio of 90:10 to prepare an applying liquid W70B30G10.

Example 3

By the same method as in Comparative Example 1, except that the applying liquid W70B30, the applying liquid W70B30G3, the applying liquid W70B30G6, and the applying liquid W70B30G10 were used, four types of organic EL element were fabricated.

In Example 3, the white light emitting polymer material corresponds to the "light emitting material A1", the blue light emitting polymer material corresponds to the "light emitting material A2", and the green light emitting polymer material corresponds to the "light emitting material A3".

The obtained four types of organic EL element were driven using a direct current and the CIE 1931 chromaticity coordinate thereof was measured when the organic EL elements emitted light with 300 cd/m². The measurement results are shown in Table 4. In Table 4, the measurement results for the organic EL element fabricated using the applying liquid W and the applying liquid B are also shown for reference. The distance $L_{Ad-A3}$ between the color coordinates Ad and A3 in the CIE 1931 chromaticity coordinate system was 0.341.

TABLE 7

| Applying liquid | Light emitting material [mixing weight ratio] | | | CIE 1931 chromaticity coordinate | | | |
|---|---|---|---|---|---|---|---|
| | A1 White light emitting polymer material | A2 Blue light emitting polymer material | A3 Green light emitting polymer material | Coordinate | CIE-x | CIE-y | $L_{Ao-A1}$*[1] |
| W | 1.000 | 0.000 | 0.000 | A1*[2] | 0.340 | 0.298 | — |
| B | 0.000 | 1.000 | 0.000 | A2*[2] | 0.168 | 0.227 | — |
| W70B30 | 0.700 | 0.300 | 0.000 | Ad*[3] | 0.308 | 0.277 | — |
| W70B30G3 | 0.679 | 0.291 | 0.030 | Ao | 0.290 | 0.327 | 0.058 |
| W70B30G6 | 0.658 | 0.282 | 0.060 | Ao | 0.276 | 0.357 | 0.087 |
| W70B30G10 | 0.630 | 0.270 | 0.100 | Ao | 0.269 | 0.398 | 0.123 |
| G | 0.000 | 0.000 | 1.000 | A3*[3] | 0.265 | 0.616 | — |

Figure 5:
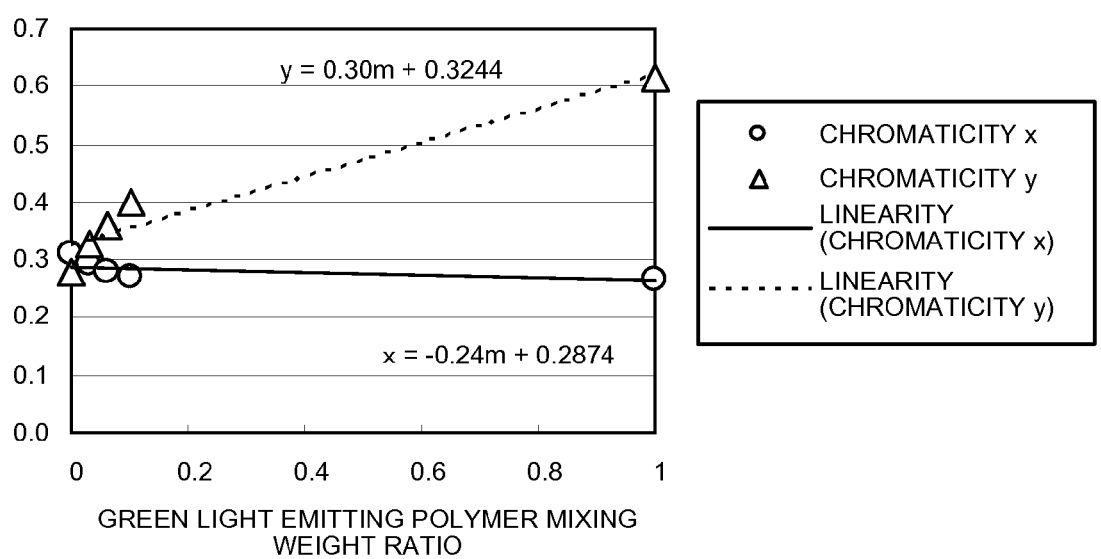
FIG. 5 is a plotted diagram of CIE 1931 chromaticity coordinates x and y for the element of Example 3.

*[1]Distance between coordinates Ao and A1 in CIE 1931 chromaticity coordinate system
*[2]Distance between coordinates A1 and A2 in CIE 1931 chromaticity coordinate system $L_{A1-A2} = 0.186$
*[3]Distance between coordinates Ad and A3 in CIE 1931 chromaticity coordinate system $L_{Ad-A3} = 0.341$ FIG. 5 illustrates a plotted diagram of CIE 1931 chromaticity coordinates x and y of the emission color of the organic EL element relative to the mixing ratio of the light emitting materials. As described above, the concentration of the light emitting moiety in the white light emitting polymer material, the concentration of the light emitting moiety in the blue light emitting polymer material, and the concentration of the light emitting moiety in the green light emitting polymer material are substantially the same as each other, so that the parameter part m in the chromaticity relational formulae is appreciated as the mixing weight ratio of the "light emitting material A3" (for the application of the chromaticity relational formulae in the three-color mixed system, refer to the description above). Therefore, on the abscissa in the plotted diagram, the mixing weight ratio of the green light emitting polymer material was plotted.

As can be appreciated from FIG. 5, the change in the chromaticity coordinate relative to the mixing weight ratio was good in linearity and exhibited only a small difference from the estimated value based on the chromaticity relational formulae.

Preparation Example 16

Preparation of Applying Liquid W60B40G2

The applying liquid W60B40 and the applying liquid G were mixed in a weight ratio of 98:2 to prepare an applying liquid W60B40G2.

Preparation Example 17

Preparation of Applying Liquid W60B40G3

The applying liquid W60B40 and the applying liquid G were mixed in a weight ratio of 97:3 to prepare an applying liquid W60B40G3.

Preparation Example 18

Preparation of Applying Liquid W60B40G6

The applying liquid W60B40 and the applying liquid G were mixed in a weight ratio of 94:6 to prepare an applying liquid W60B40G6.

Preparation Example 19

Preparation of Applying Liquid W60B40G12

The applying liquid W60B40 and the applying liquid G were mixed in a weight ratio of 88:12 to prepare an applying liquid W60B40G12.

Preparation Example 20

Preparation of Applying Liquid W60B40G18

The applying liquid W60B40 and the applying liquid G were mixed in a weight ratio of 82:18 to prepare an applying liquid W60B40G18.

Example 4

By the same method as in Comparative Example 1, except that the applying liquid W60B40, the applying liquid 60B40G2, the applying liquid W60B40G3, the applying liquid W60B40G6, the applying liquid W60B40G12, and the applying liquid W60B40G18 were used, six types of organic EL element were fabricated.

In Example 4, the white light emitting polymer material corresponds to the "light emitting material A1", the blue light emitting polymer material corresponds to the "light emitting material A2", and the green light emitting polymer material corresponds to the "light emitting material A3".

The obtained six types of organic EL element were driven using a direct current and the CIE 1931 chromaticity coordinate thereof was measured when the organic EL elements emitted light with 300 cd/m$^2$. The measurement results are shown in Table 5. In Table 5, the measurement results for the organic EL element fabricated using the applying liquid W and the applying liquid B are also shown for reference. The distance $L_{Ad-A3}$ between the color coordinates Ad and A3 in the CIE 1931 chromaticity coordinate system was 0.346.

TABLE 8

| Applying liquid | Light emitting material [mixing weight ratio] | | | CIE 1931 chromaticity coordinate | | | |
|---|---|---|---|---|---|---|---|
| | A1 White light emitting polymer material | A2 Blue light emitting polymer material | A3 Green light emitting polymer material | Coordinate | CIE-x | CIE-y | $L_{Ao-A1}$*[1] |
| W | 1.000 | 0.000 | 0.000 | A1*[2] | 0.340 | 0.298 | — |
| B | 0.000 | 1.000 | 0.000 | A2*[2] | 0.168 | 0.227 | — |
| W60B40 | 0.600 | 0.400 | 0.000 | Ad*[3] | 0.296 | 0.272 | — |
| W60B40G2 | 0.588 | 0.392 | 0.020 | Ao | 0.272 | 0.298 | 0.068 |
| W60B40G3 | 0.582 | 0.388 | 0.030 | Ao | 0.280 | 0.322 | 0.065 |
| W60B40G6 | 0.564 | 0.376 | 0.060 | Ao | 0.266 | 0.359 | 0.096 |
| W60B40G12 | 0.528 | 0.352 | 0.120 | Ao | 0.262 | 0.414 | 0.140 |
| W60B40G18 | 0.492 | 0.328 | 0.180 | Ao | 0.259 | 0.453 | 0.175 |
| G | 0.000 | 0.000 | 1.000 | A3*[3] | 0.265 | 0.616 | — |

*[1]Distance between coordinates Ao and A1 in CIE 1931 chromaticity coordinate system
*[2]Distance between coordinates A1 and A2 in CIE 1931 chromaticity coordinate system $L_{A1-A2}$ = 0.186
*[3]Distance between coordinates Ad and A3 in CIE 1931 chromaticity coordinate system $L_{Ad-A3}$ = 0.346

Figure 6:
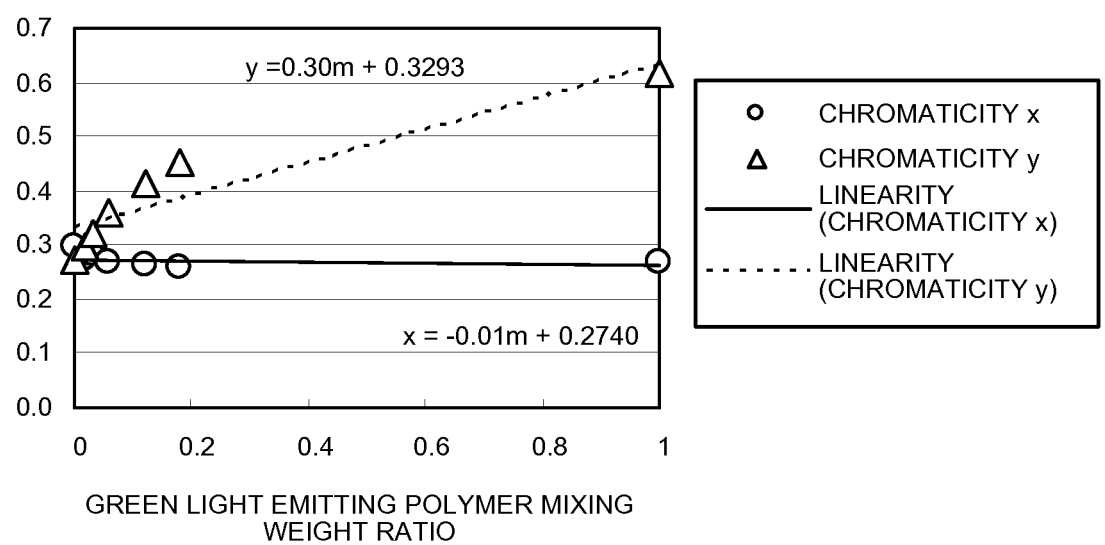
FIG. 6 is a plotted diagram of CIE 1931 chromaticity coordinates x and y for the element of Example 4.

FIG. 6 illustrates a plotted diagram of CIE 1931 chromaticity coordinates x and y of the emission color of the organic EL element relative to the mixing ratio of the light emitting materials. For the reasons described above, on the abscissa in the plotted diagram, the mixing weight ratio of the green light emitting polymer material was plotted.

As can be appreciated from FIG. 6, the change in the chromaticity coordinate relative to the mixing weight ratio was good in linearity and exhibited only a small difference from the estimated value based on the chromaticity relational formulae.

The invention claimed is:

1. An organic electroluminescent element that presents an emission color at the coordinate Ao (Xo, Yo) in CIE 1931 chromaticity coordinate system in a white region, comprising:
- a pair of electrodes; and
- a light-emitting layer provided between the electrodes, wherein
- the light-emitting layer comprises in the same layer, a white light emitting polymer material A1 that presents an emission color at the coordinate A1 (x1, y1) in CIE 1931 chromaticity coordinate system and a light emitting polymer material A2 that presents an emission color at the coordinate A2 (x2, y2) in CIE 1931 chromaticity coordinate system other than white,
- a distance $L_{Ao-A1}$ between the coordinates Ao (Xo, Yo) and A1 (x1, y1) in CIE 1931 chromaticity coordinate system satisfies $L_{Ao-A1} \leq 0.20$, and
- a distance $L_{A1-A2}$ between the coordinates A1 (x1, y1) and A2 (x2, y2) in CIE 1931 chromaticity coordinate system satisfies $0.13 \leq L_{A1-A2} \leq 0.35$, and wherein
- the light-emitting layer comprises in the same layer, a light emitting polymer material A3 that presents an emission color at the coordinate A3 (x3, y3) in CIE 1931 chromaticity coordinate system other than white in addition to the light emitting materials A1 and A2, and
- when a color coordinate of an emission color by the sum of the light emitting materials A1 and A2 is assumed to be Ad (xd, yd), a distance $L_{Ad-A3}$ between the coordinates Ad (xd, yd) and A3 (x3, y3) in CIE 1931 chromaticity coordinate system satisfies $0.13 \leq L_{Ad-A3} \leq 0.35$.

2. A method for manufacturing an organic electroluminescent element that presents an emission color at the coordinate Ao (Xo, Yo) in CIE 1931 chromaticity coordinate system in a white region and comprises a pair of electrodes and a light-emitting layer provided between the electrodes, the method comprising the step of:
- forming the light-emitting layer by applying an applying liquid comprising a white light emitting polymer material A1 that presents an emission color at the coordinate A1 (x1, y1) in CIE 1931 chromaticity coordinate system, a light emitting polymer material A2 that presents an emission color at the coordinate A2 (x2, y2) in CIE 1931 chromaticity coordinate system other than white and a solvent, wherein
- a distance $L_{Ao-A1}$ between the coordinates Ao (Xo, Yo) and A1 (x1, y1) in CIE 1931 chromaticity coordinate system satisfies $L_{Ao-A1} \leq 0.20$, and
- a distance $L_{A1-A2}$ between the coordinates A1 (x1, y1) and A2 (x2, y2) in CIE 1931 chromaticity coordinate system satisfies $0.13 \leq L_{A1-A2} \leq 0.35$, and wherein
- the applying liquid further comprises a light emitting polymer material A3 that presents an emission color at the coordinate A3 (x3, y3) in CIE 1931 chromaticity coordinate system other than white, and
- when a color coordinate of an emission color by the sum of the light emitting materials A1 and A2 is assumed to be Ad (xd, yd), a distance $L_{Ad-A3}$ between the coordinates Ad (xd, yd) and A3 (x3, y3) in CIE 1931 chromaticity coordinate system satisfies $0.13 \leq L_{Ad-A3} \leq 0.35$.

* * * * *